(12) United States Patent
Perreault et al.

(10) Patent No.: US 9,755,576 B2
(45) Date of Patent: Sep. 5, 2017

(54) TUNABLE MATCHING NETWORK WITH PHASE-SWITCHED ELEMENTS

(71) Applicant: Massachusetts Institute of Technology, Cambridge, MA (US)

(72) Inventors: David J. Perreault, Andover, MA (US); Alexander Sergeev Jurkov, Jamaica Plain, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/974,563

(22) Filed: Dec. 18, 2015

(65) Prior Publication Data
US 2016/0181986 A1 Jun. 23, 2016

Related U.S. Application Data

(60) Provisional application No. 62/094,144, filed on Dec. 19, 2014.

(51) Int. Cl.
| | |
|---|---|
| H03F 1/02 | (2006.01) |
| H03F 1/56 | (2006.01) |
| H03F 3/19 | (2006.01) |
| H03F 3/21 | (2006.01) |
| H03F 3/193 | (2006.01) |
| H03F 3/217 | (2006.01) |

(Continued)

(52) U.S. Cl.
CPC ............ *H03F 1/0205* (2013.01); *H03F 1/56* (2013.01); *H03F 1/565* (2013.01); *H03F 3/19* (2013.01); *H03F 3/193* (2013.01); *H03F 3/21* (2013.01); *H03F 3/2171* (2013.01); *H03F 3/2176* (2013.01); *H03F 3/245* (2013.01); *H03H 7/38* (2013.01); *H03F 2200/301* (2013.01); *H03F 2200/387* (2013.01); *H03F 2200/391* (2013.01); *H03F 2200/451* (2013.01)

(58) Field of Classification Search
CPC .......... H03F 1/0205; H03F 1/56; H03F 1/565; H03F 3/19; H03F 3/193; H03F 3/21; H03F 3/2171; H03F 3/2176; H03F 3/245; H03H 7/38
USPC .......................................................... 333/32
See application file for complete search history.

(56) References Cited

U.S. PATENT DOCUMENTS

| | | |
|---|---|---|
| 3,800,167 A | 3/1974 | Smith |
| 6,587,017 B1 | 7/2003 | Sheng et al. |
| 6,887,339 B1 | 5/2005 | Goodman et al. |

(Continued)

OTHER PUBLICATIONS

U.S. Appl. No. 15/149,491, filed May 9, 2016, Perreault, et al.

(Continued)

*Primary Examiner* — Stephen E Jones
*Assistant Examiner* — Scott S Outten
(74) *Attorney, Agent, or Firm* — Daly, Crowley, Mofford & Durkee, LLP

(57) ABSTRACT

Described is a phase-switched tunable impedance matching network (PS-TMN). The PS-TMN has an input that can be coupled to a source and an output that can be coupled to a load. The PS-TMN includes one or more phase-switched reactive elements and a controller. The controller provides a control signal to each of the one or more phase-switched reactive elements. In response to one or more control signals provided thereto, each phase-switched reactive element provides a corresponding selected reactance value.

22 Claims, 17 Drawing Sheets

(51) Int. Cl.
H03F 3/24 (2006.01)
H03H 7/38 (2006.01)

(56) References Cited

U.S. PATENT DOCUMENTS

| | | | |
|---|---|---|---|
| 8,054,892 | B2 | 11/2011 | Aziz et al. |
| 8,279,950 | B2 | 10/2012 | Aziz et al. |
| 8,633,782 | B2 | 1/2014 | Nagarkatti et al. |
| 8,718,188 | B2 | 5/2014 | Balteanu et al. |
| 8,890,618 | B2 | 11/2014 | Pamarti et al. |
| 2008/0218291 | A1 | 9/2008 | Zhu et al. |
| 2012/0056689 | A1 | 3/2012 | Spears et al. |
| 2013/0033118 | A1 | 2/2013 | Karalis et al. |
| 2014/0167513 | A1 | 6/2014 | Chang et al. |
| 2014/0226378 | A1 | 8/2014 | Perreault et al. |
| 2014/0266433 | A1 | 9/2014 | Nobbe et al. |
| 2014/0313781 | A1 | 10/2014 | Perreault et al. |
| 2014/0339918 | A1 | 11/2014 | Perreault et al. |
| 2014/0355322 | A1 | 12/2014 | Perreault et al. |
| 2015/0023063 | A1 | 1/2015 | Perreault et al. |
| 2015/0084701 | A1 | 3/2015 | Perreault et al. |
| 2015/0155895 | A1 | 6/2015 | Perreault et al. |
| 2015/0171768 | A1 | 6/2015 | Perreault et al. |
| 2015/0188448 | A1 | 7/2015 | Perreault et al. |
| 2016/0173032 | A1* | 6/2016 | Kuttner ............... H03F 1/0205 375/297 |

OTHER PUBLICATIONS

U.S. Appl. No. 14/968,045, filed Dec. 14, 2015, Perreault et al.
U.S. Appl. No. 14/975,742, filed Dec. 19, 2015, Perreault et al.
Response to Oct. 5, 2016 Office Action for U.S. Appl. No. 14/975,742, filed Jan. 5, 2017; 14 pages.
U.S. Appl. No. 15/290,402, filed Oct. 11, 2016, Perreault, et al.
U.S. Appl. No. 15/287,068, filed Oct. 6, 2016, Briffa, et al.
U.S. Appl. No. 15/354,170, filed Nov. 17, 2016, Briffa, et al.
Non-Final Office Action dated Oct. 5, 2016; for U.S. Appl. No. 14/975,742, 17 pages.
U.S. Appl. No. 14/920,031, filed Oct. 22, 2015, Briffa, et al.
U.S. Appl. No. 14/968,045, filed Dec. 14, 2015, Perreault, et al.
U.S. Appl. No. 14/934,760, filed Nov. 6, 2015, Briffa, et al.
U.S. Appl. No. 14/823,220, filed Aug. 11, 2015, Barton et al.
U.S. Appl. No. 14/435,914, filed Apr. 15, 2015, Perreault, et al.
U.S. Appl. No. 14/758,033, filed Jun. 26, 2015, Perreault et al.
U.S. Appl. No. 14/791,685, filed Jul. 6, 2015, Perreault et al.
U.S. Appl. No. 14/911,774, filed Feb. 2, 2016, Chen et al.
F. Chan Wai Po, et. al., "A novel method for synthesizing an automatic matching network and its control unit," *IEEE Transactions on Circuits and Systems—I*, vol. 58, No. 9, pp. 2225-2235, Sep. 2011 (12 pages).
T. Nesimoglu, et. al., "A frequency tunable broadband amplifier utilizing tunable capacitors and inductors," *2013 Conference on Microwave Techniques*, pp. 65-68, Apr. 2013 (4 pages)
Y. Sun, J. Moritz, and X. Zhu, "Adaptive impedance matching and antenna tuning for green software-defined and cognitive radio," *2011 IEEE 54th International Midwest Symposium on Circuits and Systems(MWSCAS)*, pp. 1-4, Aug. 2011 (4 pages).
Y. Lim, et. al., "An adaptive impedance-matching network based on novel capacitor matrix for wireless power transfer," *IEEE Transactions on Power Electronics*, vol. 29, No. 8, pp. 4403-4413, Aug. 2014. (11 pages).
G. J. J. Winands, et. al., "Matching a pulsed power modulator to a corona plasma reactor," *2007 IEEE International Pulsed Power Conference*, pp. 587-590, Jun. 2007. (4 pages).

Nemati, et. al., "Design of Varactor-based tunable matching networks for dynamic load modulation of high power amplifiers," *IEEE Transactions on Microwave Theory and Techniques*, vol. 57, No. 5, pp. 1110-1118, May 2009. (9 pages).
W. C. E. Neo, et. al., "Adaptive multi-band multi-mode power amplifier using integrated Varactor-based tunable matching networks," *IEEE Journal of Solid-State Circuits*, vol. 41, No. 9, pp. 2166-2176, Sep. 2006. (11 pages).
Q. Shen and N. S. Barker, "Distributed MEMS tunable matching network using minimal-contact RF-MEMS varactors," *IEEE Transactions on Microwave Theory and Technology*, vol. 54, No. 6, pp. 2646-2658, Jun. 2006. (13 pages).
A. van Bezooijen, et. al., "A GSM/EDGE/WCDMA adaptive series-LC matching network using RF-MEMS switches," *IEEE Journal of Soli-State Circuits*, vol. 43, No. 10, pp. 2259-2268, Oct. 2008. (10 pages).
C. Sanchez-Perez, et. al., "Design and applications of a 300-800 MHz tunable matching network," *IEEE Journal on Emerging and Selected Topics in Circuits and Systems*, vol. 3, No. 4, Dec. 2013 (10 pages).
P. Sjoblom and H. Sjoland, "Measured CMOS switched high-quality capacitors in a reconfigurable matching network," *IEEE Transactions on Circuits and Systems II*, vol. 54, No. 10, pp. 858-862, Oct. 2007 (5 pages).
R. Malmqvist, et. al., "RF MEMS based impedance matching networks for tunable multi-band microwave low noise amplifiers," in *Proc. 2009 International Semiconductor Conference*, vol. I, pp. 303-306. (4 pages).
J. Mitola, "The software radio architecture," *IEEE Communications Magazine*, vol. 33, No. 5, pp. 26-38, May 1995. (13 pages).
E. Din, et. al., "Efficiency enhancement of class-F GaN power amplifiers using load modulation," *2010 German Microwave Conference*, pp. 114-117, Mar. 15-17, 2010. (4 pages).
M. Schmidt, et. al., "A comparison of tunable ferroelectric Il- and T-matching networks," in *Proc. 37th European Microwave Conference*, pp. 98-101, Oct. 9-12, 2007. (4 pages).
W. Gu, and K. Harada, "A new method to regulate resonant converters," *IEEE Transactions on Power Electronics*, vol. 3, No. 4, Oct. 1988 (10 pages).
A. Jurkov, L. Roslaniec, and D. Perreault, "Lossless multiway power combining and outphasing for high-frequency resonant inverters," *IEEE Transactions on Power Electronics*, vol. 29, No. 4, pp. 1894-1908, Apr. 2014. (15 pages).
L. Roslaniec, et. al., "Design of single-switch inverters for variable resistance/load modulation operation," *IEEE Transactions on Power Electronics*, accepted for publication (15 pages).
E. Waffenschmidt, "Dynamic Resonant Matching Method for a Wireless Power Transmission Receiver", *IEEE Transactions on Power Electronics*, vol. 30, No. 11, Nov. 2015 (8 pages).
Denieport; "Medical Power Generator Using a Voltage Mode Resonant Converter Controlled by a Synchronous Switched Capacitor is MRI Compatible"; 2014 $21^{st}$ IEEE International Conference on Electronics, Circuits and Systems (ICECS); Dec. 7-10, 2014; 4 Pages.
Response to Office Action dated Mar. 7, 2017 from U.S. Appl. No. 14/975,742, filed Jun. 7, 2017; 13 Pages.
PCT International Preliminary Report on Patentability dated Jun. 29, 2017 from International Application No. PCT/US2015/066722; 10 Pages.
Office Action dated Mar. 7, 2017 for U.S. Appl. No. 14/975,742; 15 pages.

* cited by examiner

100

1500

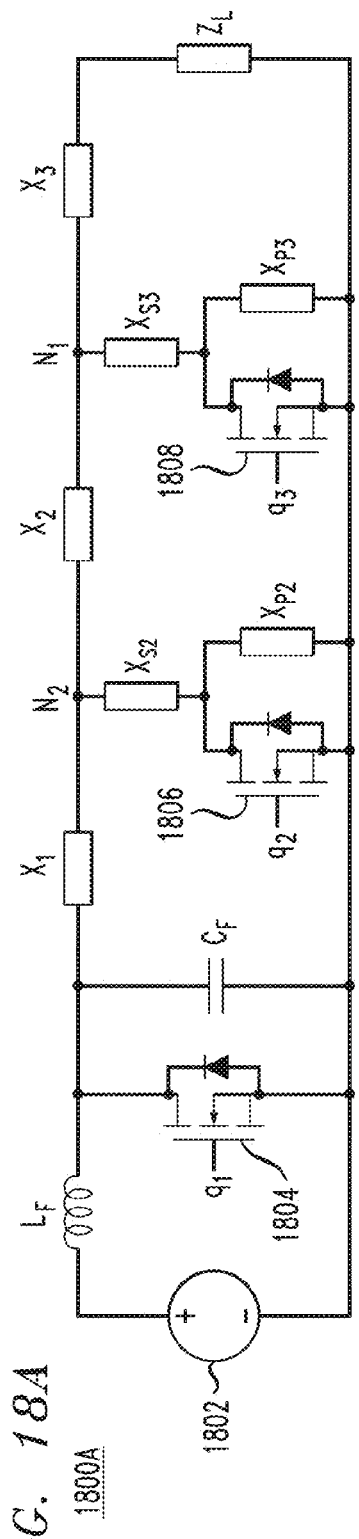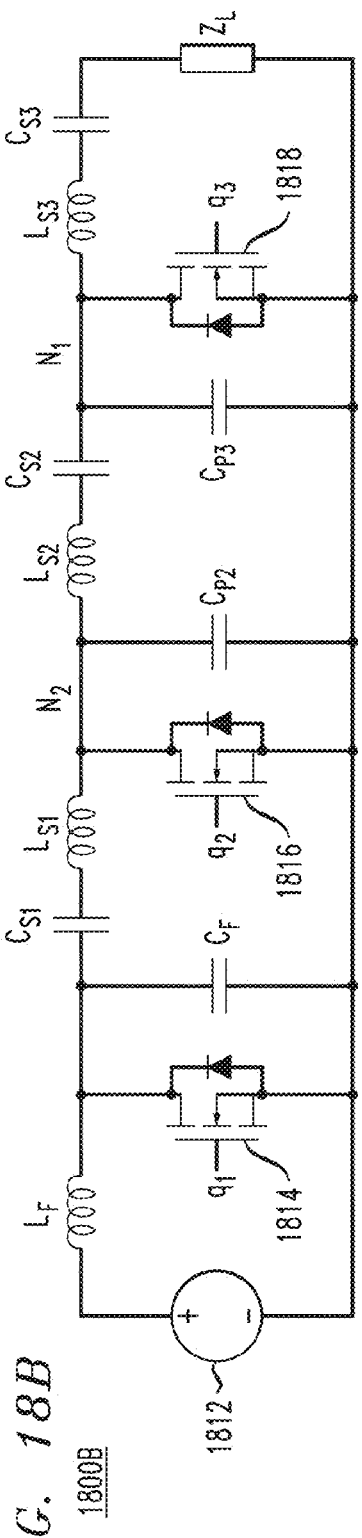
FIG. 18A
1800A
FIG. 18B
1800B

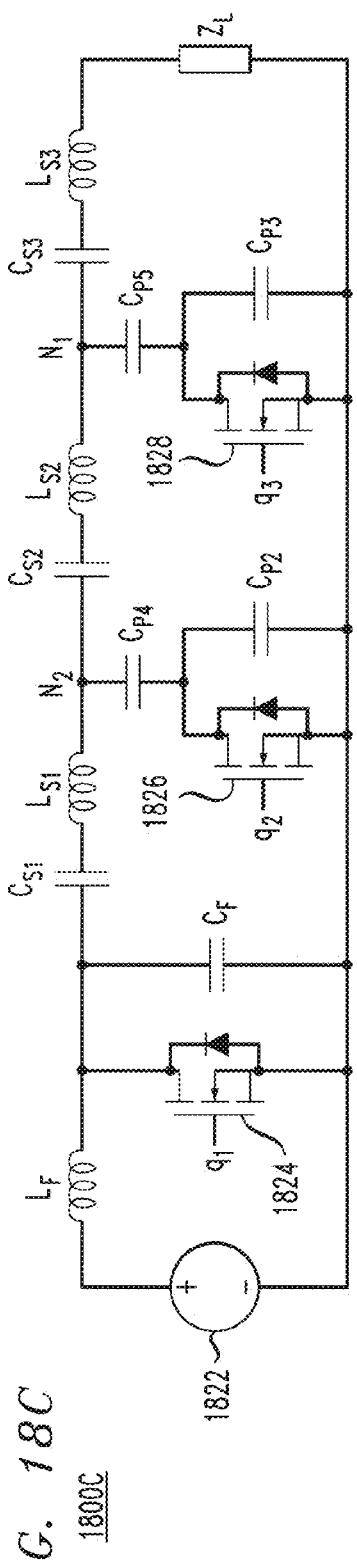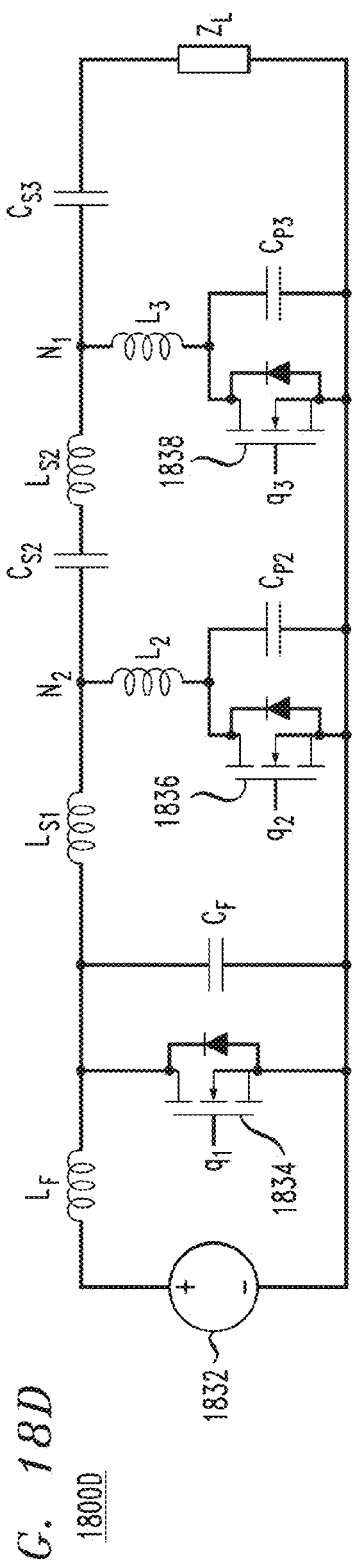

1800E

1900

2000

2100

2200

2300

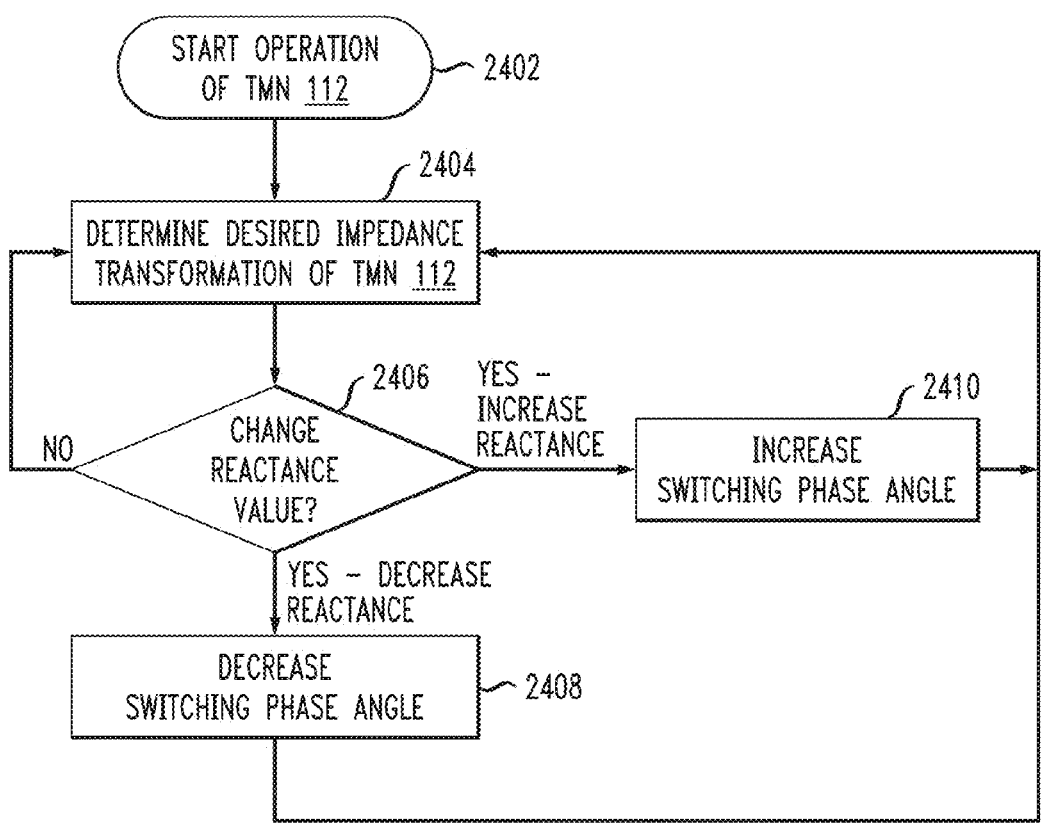

TUNABLE MATCHING NETWORK WITH PHASE-SWITCHED ELEMENTS

CROSS-REFERENCE TO RELATED APPLICATION

This application claims the benefit under 35 U.S.C. §119 (e) of the filing date of U.S. provisional application No. 62/094,144, filed on Dec. 19, 2014, which is hereby incorporated herein by reference in its entirety.

BACKGROUND

Impedance matching networks are commonly used for maximizing power transfer within many radio frequency (RF) and microwave systems. For example, in RF transmitters, impedance matching networks might be used to provide an impedance match from an output impedance of an RF power amplifier (PA) to an impedance of an RF load (e.g., an antenna). Such impedance matching increases the transmitted power, reduces power loss and reduces or eliminates the need for additional circuit elements (e.g., isolators, etc.).

One class of impedance matching networks is referred to as tunable impedance matching networks (TMNs), sometimes called automatic antenna tuning units. Conventional TMNs might be implemented as single-element or lumped-element reactive networks where at least one of the reactive elements are variable (e.g., tunable) components such that the impedance of the variable components at a particular frequency, or over a range of frequencies, can be modified. The reactive elements within a TMN might be arranged in circuit topologies such as a ladder-network, an L-network, a T-network, or a Pi-network.

Conventional TMNs can be classified as either analog (continuously adjustable) or digital (adjustable among a set of discrete values). Analog TMNs utilize variable reactance elements having reactance values (at some frequency or over a range of frequencies) that can be tuned in a continuous manner by adjusting bias conditions. Digital TMNs implement the variable reactive elements as digitally switched arrays of static reactance elements. This approach allows adjustment of the impedance of the reactance values in finite and discrete steps.

Analog TMNs are often implemented using varactor diodes (or varactor diode circuits) or micro-electromechanical systems (MEMS) varactors. Although analog TMNs allow fast and accurate impedance matching over a wide range of impedances, relatively high bias voltages are required to operate at high power levels.

Digital TMNs are often implemented using CMOS switches, MEMS switches, PIN diodes or discrete power transistors. Although MEMS switches have low on-state resistance and can operate up to tens of GHz with low power consumption, MEMS switches require large control voltages. PIN diode and CMOS switch-based digital TMNs exhibit low-to-moderate on-state resistance and, thus, can handle high power levels at the expense of some resistive power loss. PIN diode and CMOS switch-based digital TMNs are favorable for on-die integration, for example for Software Defined Radio (SDR) integrated circuits (ICs) and other on-chip TMNs. Digital TMNs, however, exhibit limited tuning resolution, and hence, limited accuracy with which impedance matching can be achieved. In some high power applications where accurate impedance matching is required over a very wide impedance range, such as RF plasma drivers, the use of digital TMNs can be impractical due to the large number of digital switches needed to achieve the required fine-tuning resolution.

SUMMARY

This Summary is provided to introduce a selection of concepts in a simplified form that are further described below in the Detailed Description. This Summary is not intended to identify key or essential features or combinations of the claimed subject matter, nor is it intended to be used to limit the scope of the claimed subject matter.

It has been recognized that there is a need for TMNs having increased accuracy and/or faster impedance matching relative to existing TMNs. It has also been recognized that there is a need for TMNs having increased accuracy and/or faster impedance matching with higher tuning bandwidth over wider impedance ranges, while simultaneously allowing operation at higher power levels with low insertion losses.

One aspect of the concepts, systems and techniques described herein is directed toward a phase-switched tunable impedance network has an input configured to be coupled to a source and having an output configured to be coupled to a load and one or more phase-switched reactive elements. A controller coupled to the phase-switched tunable impedance network provides a respective control signal to each of the one or more phase-switched reactances. In response to the respective control signal provided thereto, each phase-switched reactive element provides a desired reactance value.

With this particular arrangement, phase-switched TMNs having increased accuracy and/or faster impedance matching as compared to prior art TMNs are provided. The phase-switched TMNs also provide increased accuracy and/or faster impedance matching with higher tuning bandwidth over wider impedance ranges as compared to prior art approaches, while simultaneously allowing operation at higher power levels with low insertion losses. In some embodiments, the reactance values of one or more of the one or more phase-switched reactive elements may be the same and in other embodiments, each of the one or more phase-switched reactive elements may have different reactance values.

In embodiments, the controller is internal to the phase-switched TMN. In one embodiment, the controller is external to the phase-switched TMN. In embodiments, a portion of the controller is internal to the phase-switched TMN and a portion of the controller is external to the phase-switched TMN.

In embodiments, setting each phase-switched reactance to a corresponding desired reactance value achieves an impedance match between the source and the load. In embodiments, setting each phase-switched reactance to a corresponding desired reactance value achieves a desired impedance transformation between the source and the load. In another embodiment, setting each phase-switched reactance to a corresponding desired reactance value achieves a desired first impedance to the source, and a desired second impedance to the load.

In embodiments, each of the one or more phase-switched reactive elements includes one or more reactive elements and at least one switch. The at least one of the one or more reactive elements is configured to be switched into and out of the reactance network by at least one switch associated therewith.

In an embodiment, the at least one associated switch is operable at a switching frequency related to a characteristic (e.g. a frequency) of an RF signal provided by the source and a switching phase based upon the respective control signal.

In an embodiment, the at least one associated switch is operable at a switching frequency related to a frequency of an RF signal provided by the source and a switching phase based upon the respective control signal. In an embodiment, the at least one associated switch is operable at a switching frequency and a switching phase that is related to that of the RF signal processed from the RF source. In at least some cases, the switch is switched once per RF cycle with a timing controlled to provide the desired reactance value. In an embodiment, depending upon whether the system is full wave or half wave, switching could occur once per RF cycle or twice per RF cycle.

In an embodiment, the at least one switch is operable in a half-wave switching configuration to switch on and off once per cycle of the RF signal at the output port of the RF amplifier. In an embodiment, the at least one switch is operable in a full-wave switching configuration to switch on and off twice per cycle of the RF signal at the output port of the RF amplifier. In an embodiment, the switching frequency and the switching phase are selected to provide the phase-switched reactance having a desired reactance value. In other embodiments, other relations to the RF frequency may also be used.

In an embodiment, the at least one associated switch is switched on and off at a frequency of the RF signal processed from the RF source and with timing to provide a phase-switched reactance having a desired reactance value.

In an embodiment, the at least one associated switch switches on and off once per RF cycle of the RF source with timing to provide a phased-switched reactance having a desired reactance value.

In an embodiment, the at least one associated switch switches on and off once per RF cycle of the RF source with timing to provide a phased-switched reactance having a desired reactance value and providing at least one of zero voltage switching and zero current switching of the switch.

In an embodiment, the switching frequency and the switching phase are selected to provide the phase-switched reactance having a desired reactance value.

In an embodiment, the at least one switch is operable to provide at least one of zero-voltage-switching (ZVS) and zero-current-switching (ZCS) of the switch.

In an embodiment, the controller is configured to determine the switching frequency and select the switching phase based upon at least one of: a feedback circuit, a feedforward circuit, and an adaptive predistortion system. In an embodiment, the adaptive predistortion system includes a lookup table.

In one embodiment, the control signal operates in a half-wave switching configuration based upon a signal provided from the source. In another embodiment, the control signal operates in a full-wave switching configuration based upon a signal provided from the source.

In an embodiment, the adaptive predistortion system comprises a lookup table.

In one embodiment, the phase-switched reactance is a capacitive element, and the capacitance value of the phase-switched capacitive element at a desired frequency is related to a physical DC capacitance value of the phase-switched capacitive element and the switching phase. In another embodiment, the phase-switched reactance is an inductive element, and the inductance value of the phase-switched inductive element at a desired frequency is related to a physical DC inductance value of the phase-switched inductive element and the switching phase.

In an embodiment, the tunable impedance network includes a digital reactance matrix having N selectable reactive elements to adjust an effective reactance value of the digital reactance matrix, where N is a positive integer.

In an embodiment, the tunable impedance network includes one or more analog variable reactive elements.

In an embodiment, the source is at least one of a radio frequency (RF) source, an RF power amplifier (PA), and a switched-mode inverter, and the load is at least one of an antenna, a transmission line and a plasma load.

In an embodiment, the input of the tunable impedance network is coupled to a radio frequency (RF) amplifier system. The tunable impedance network modulates a load impedance of the RF amplifier system to control a power level of the RF amplifier system.

In an embodiment, the tunable impedance network includes one or more filter components to reduce harmonic content coupled to at least one of the input and the output.

In another aspect, a method of operating a tunable impedance network is provided. The tunable impedance network includes an input configured to be coupled to a source, an output configured to be coupled to a load, and one or more phase-switched reactances. A controller coupled to the tunable impedance network determines a desired impedance value of the tunable impedance network. The controller provides a respective control signal to each of the one or more phase-switched reactances. In response to the respective control signal provided thereto, a corresponding desired reactance value of each phase-switched reactance is set.

In one embodiment, setting each phase-switched reactance to a corresponding desired reactance value achieves an impedance match between the source and the load. In another embodiment, setting each phase-switched reactance to a corresponding desired reactance value achieves a desired impedance transformation between the source and the load. In another embodiment, setting each phase-switched reactance to a corresponding desired reactance value achieves a desired first impedance to the source, and a desired second impedance to the load.

In an embodiment, each of the one or more phase-switched reactances is provided from a combination of one or more reactive elements and at least one switch. The at least one of the one or more reactive elements is configured to be switched into and out of the reactance network by at least one switch associated therewith.

In an embodiment, the at least one associated switch is operable at a switching frequency and a switching phase based upon the respective control signal.

In an embodiment, the switching frequency and the switching phase are selected to provide the phase-switched reactance having a desired reactance value.

In an embodiment, the at least one associated switch is operable at a switching frequency related to the frequency of the RF amplifier system and a switching phase based upon the respective control signal.

In an embodiment, the at least one associated switch is switched on and off once per RF cycle of the RF amplifier system with a switch timing selected to provide the phase switched-reactance having a desired reactance value and providing at least one of zero-voltage switching and zero-current switching of said switch. In an embodiment, the controller determines the switching frequency and selects the switching phase based upon at least one of: a feedback circuit, a feedforward circuit, and an adaptive predistortion system.

In an embodiment, the at least one switch is operated at a switching frequency related to a frequency of an RF signal provided by the source and a switching phase based upon the respective control signal. In an embodiment, the at least one switch is operated in a half-wave switching configuration to switch on and off once per cycle of the RF signal at the output port of the RF amplifier. In an embodiment, the at least one switch is operated in a full-wave switching configuration to switch on and off twice per cycle of the RF signal at the output port of the RF amplifier.

In an embodiment, the at least one switch is operated to provide at least one of zero-voltage-switching (ZVS) and zero-current-switching (ZCS) of said switch.

In an embodiment, the phase-switched reactance comprises a capacitive element, and the capacitance value of the phase-switched capacitive element at a desired frequency is related to a physical DC capacitance value of the phase-switched capacitive element and the switching phase.

In one embodiment, the phase-switched reactance is a capacitive element, and the capacitance value of the phase-switched capacitive element at a desired frequency is related to a physical DC capacitance value of the phase-switched capacitive element and the switching phase. In another embodiment, the phase-switched reactance is an inductive element, and the inductance value of the phase-switched inductive element at a desired frequency is related to a physical DC inductance value of the phase-switched inductive element and the switching phase.

In an embodiment, the tunable impedance network includes a digital reactance matrix having N selectable reactive elements to adjust an effective reactance value of the digital reactance matrix, where N is a positive integer.

In an embodiment, the tunable impedance network includes one or more analog variable reactive elements.

In an embodiment, the source is at least one of a radio frequency (RF) source, an RF power amplifier (PA), and a switched-mode inverter, and the load is at least one of an antenna, a transmission line and a plasma load.

In an embodiment, the input of the tunable impedance network is coupled to a radio frequency (RF) amplifier system. The tunable impedance network modulates a load impedance of the RF amplifier system to control a power level of the RF amplifier system.

In an embodiment, the tunable impedance network includes one or more filter components to reduce harmonic content coupled to at least one of the input and the output.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

Figure 1:
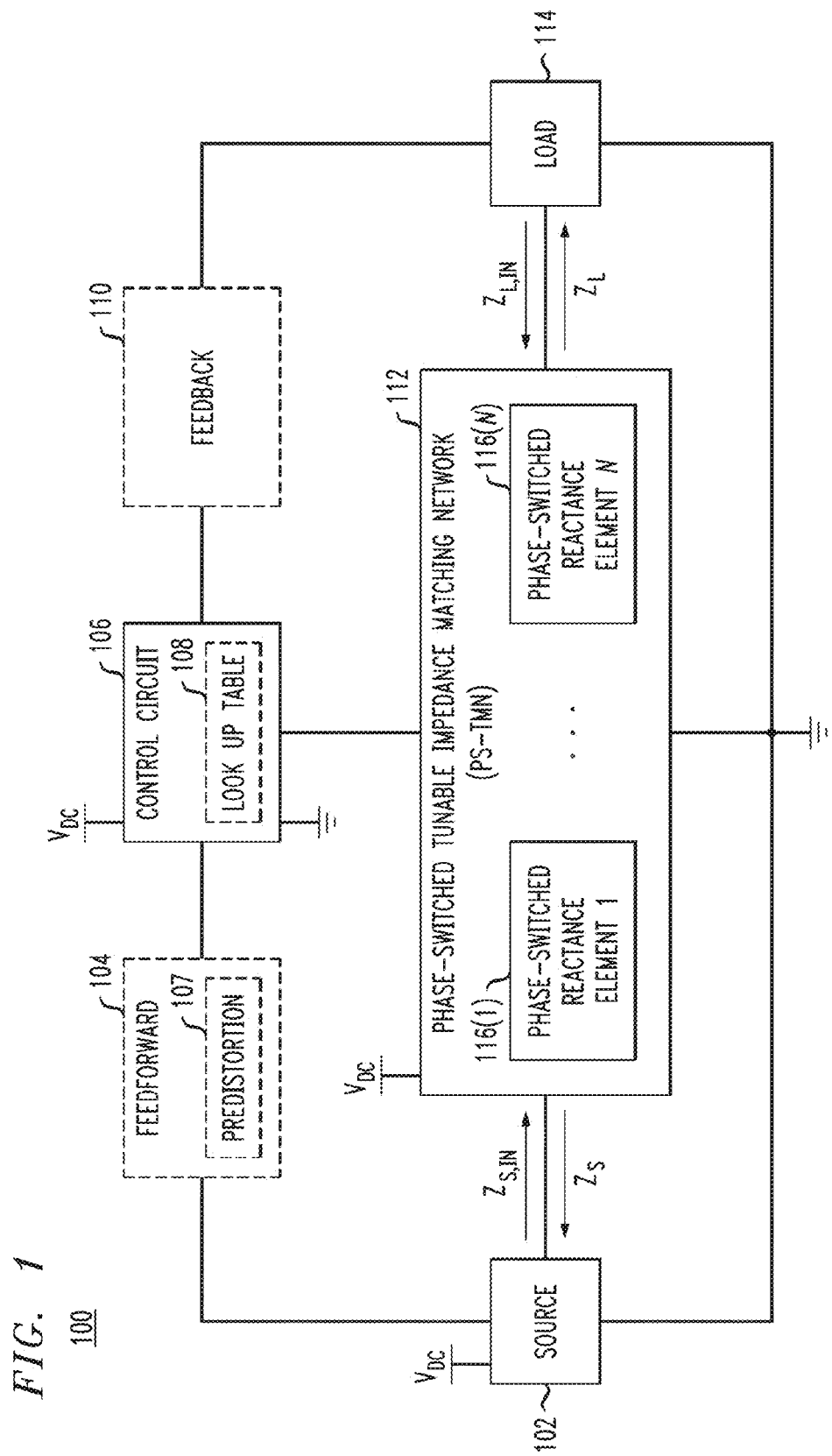
FIG. 1 is a block diagram of an illustrative tunable impedance matching network (TMN) in accordance with described embodiments.
Figure 11:
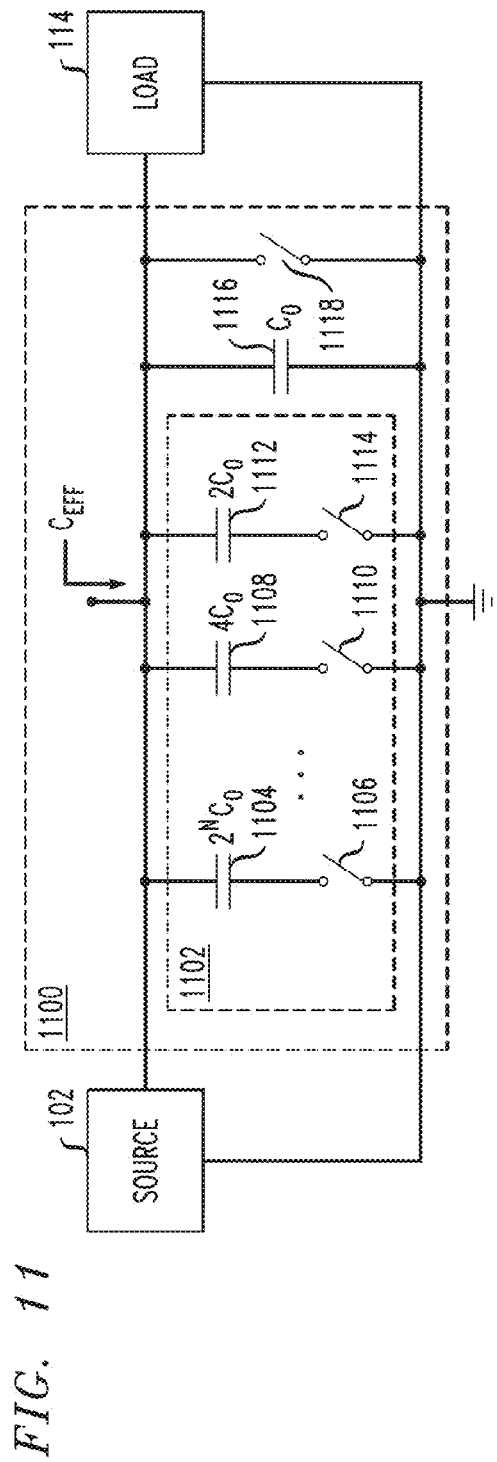
Figure 12:
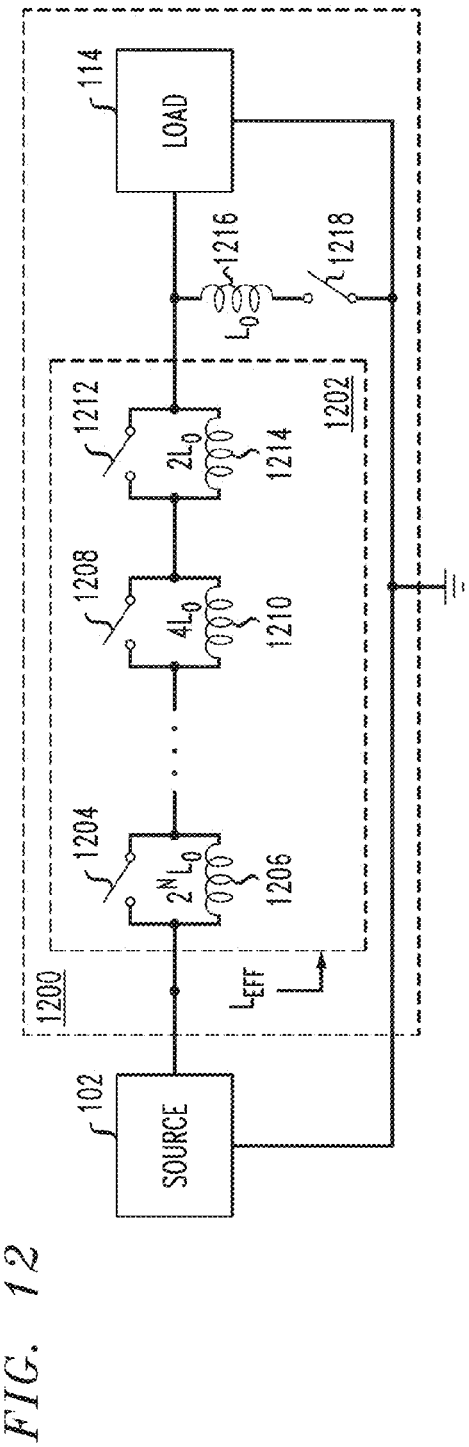
Figure 13:
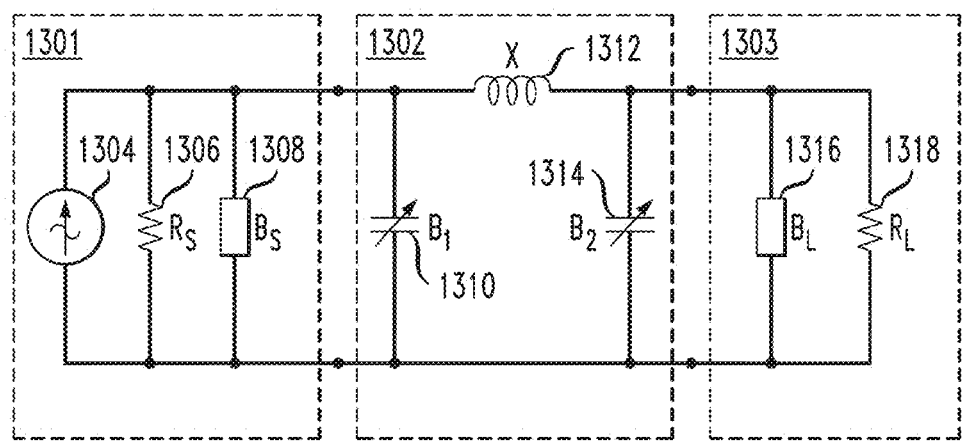
Figure 14:
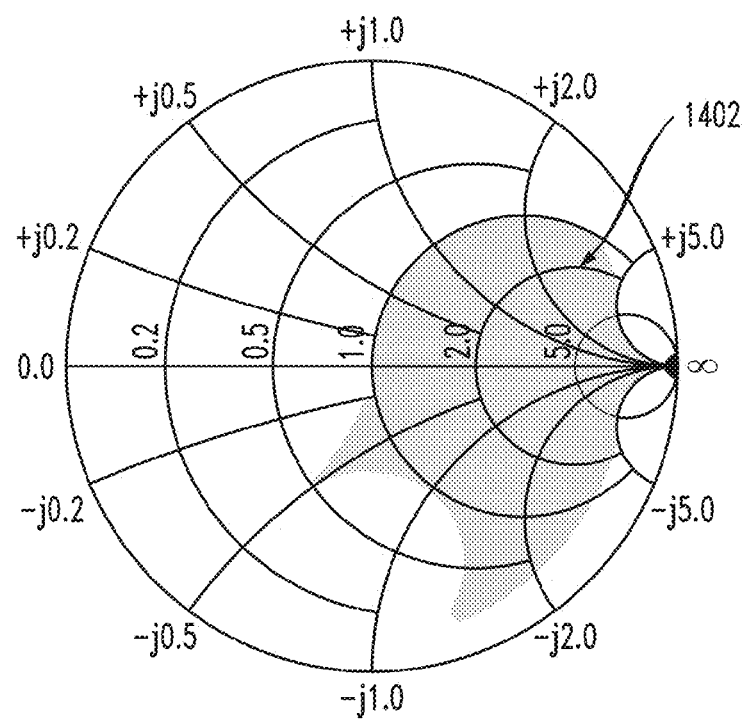
Figure 15:
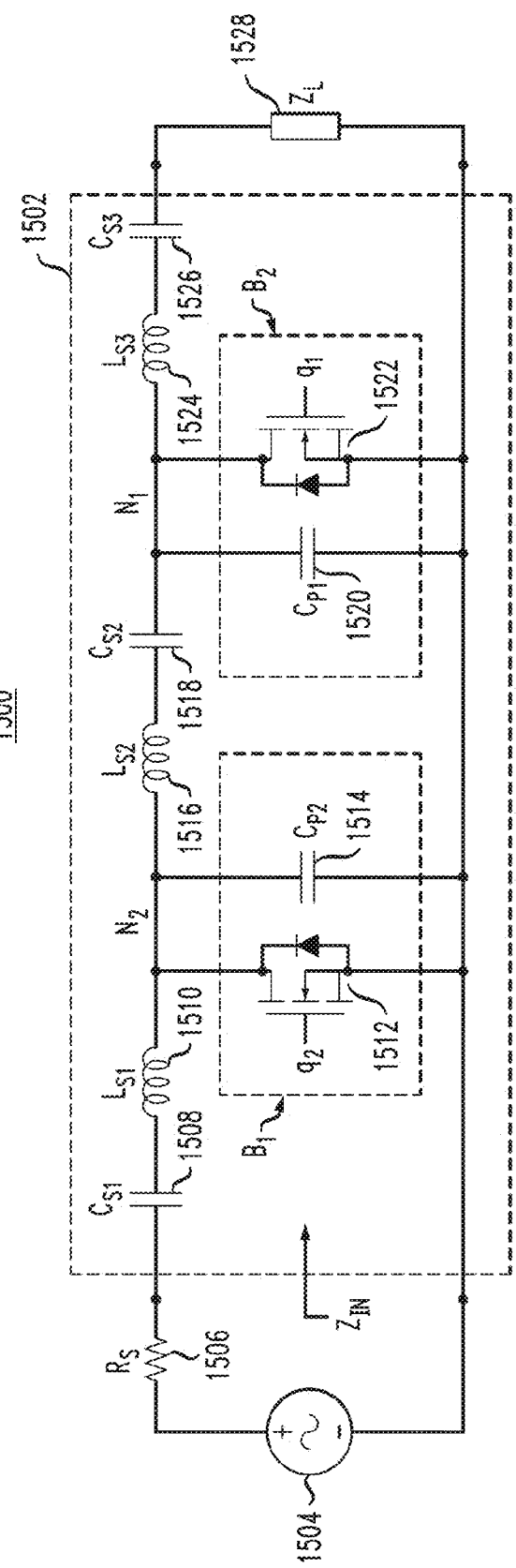
Figure 16:
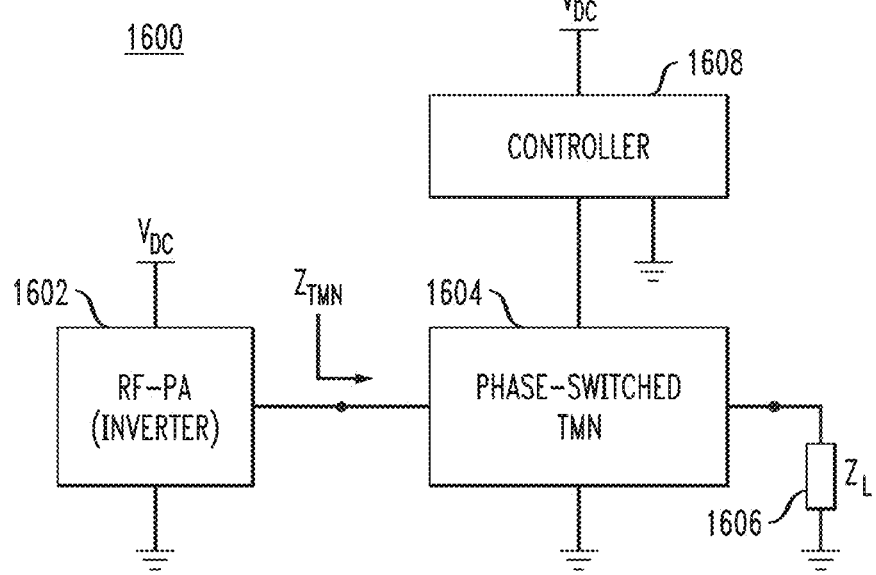
Figure 17:
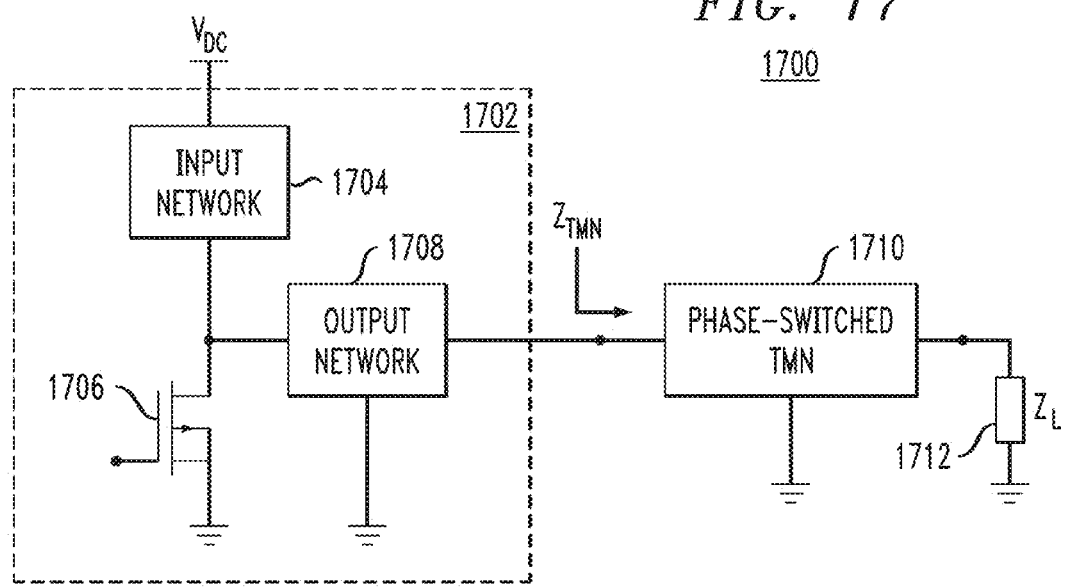
Figure 19:
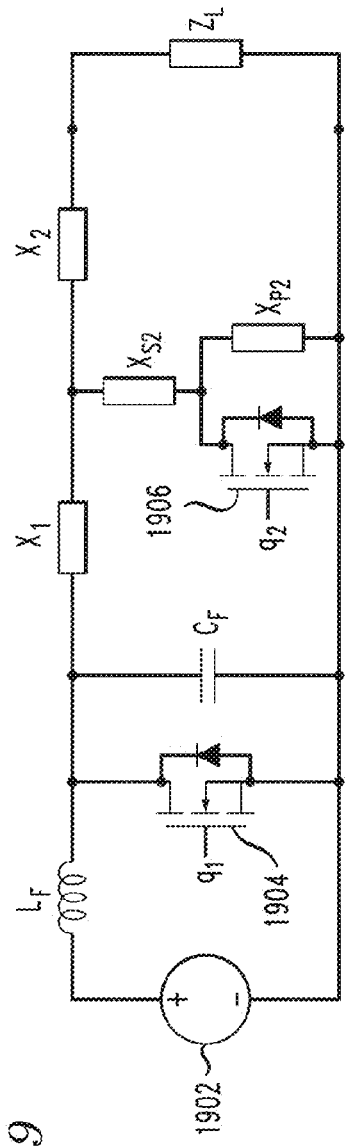
Figure 20:
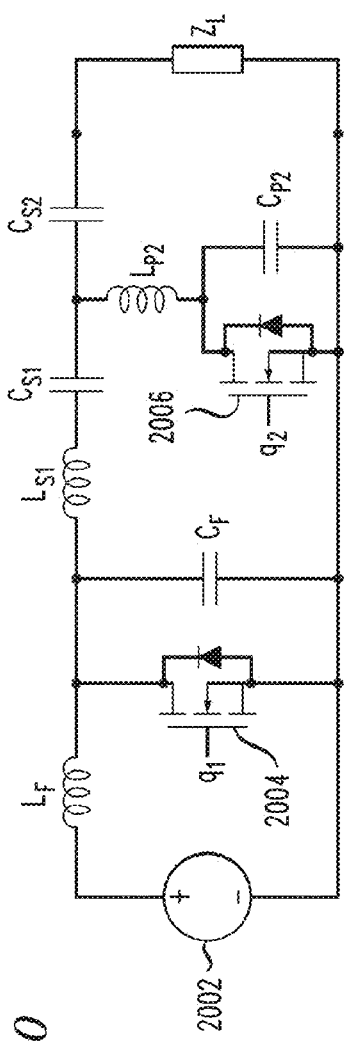
Figure 21:
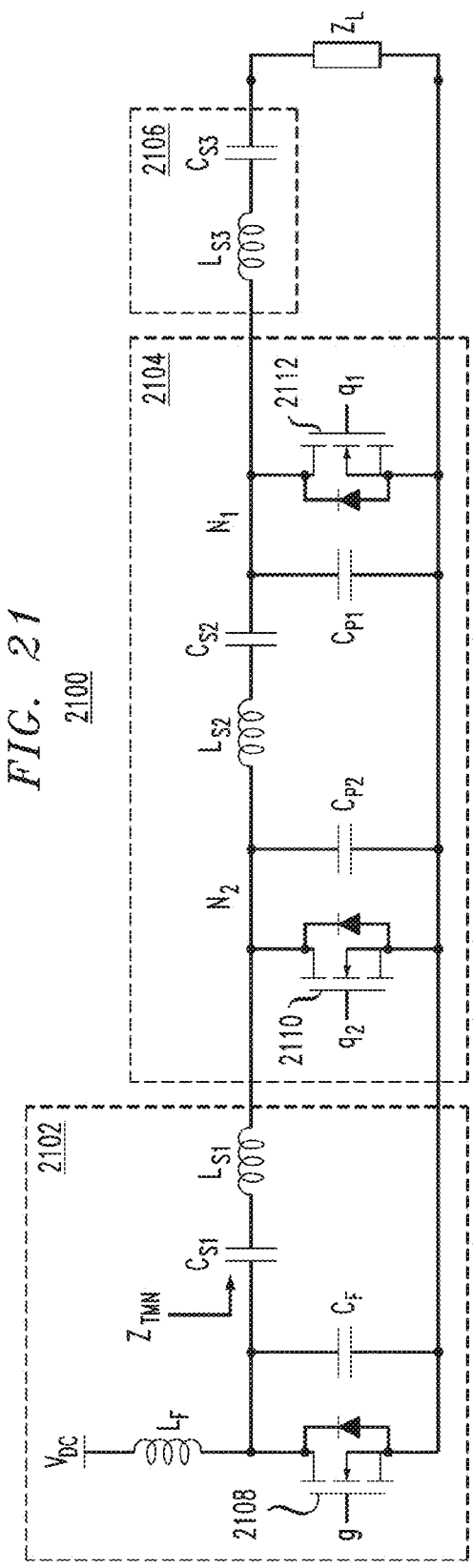
Figure 22:
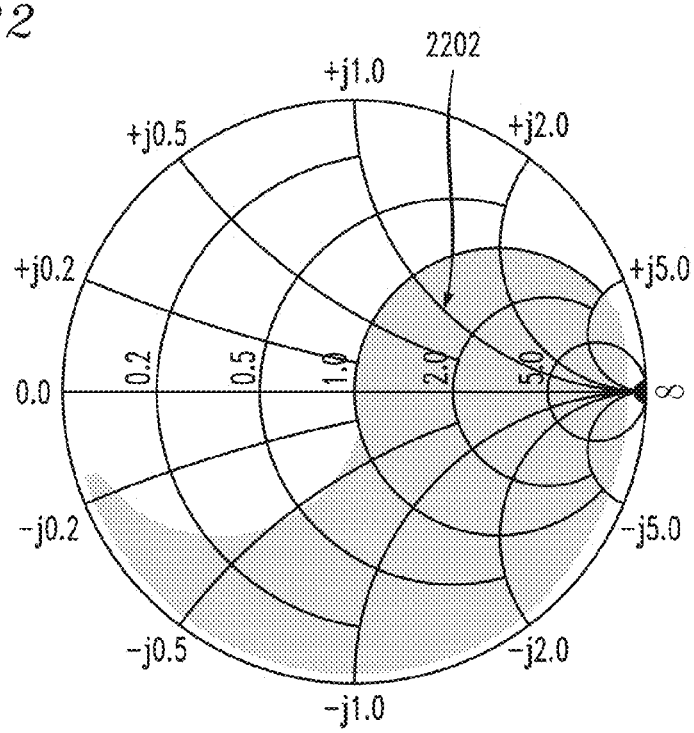
Figure 23:
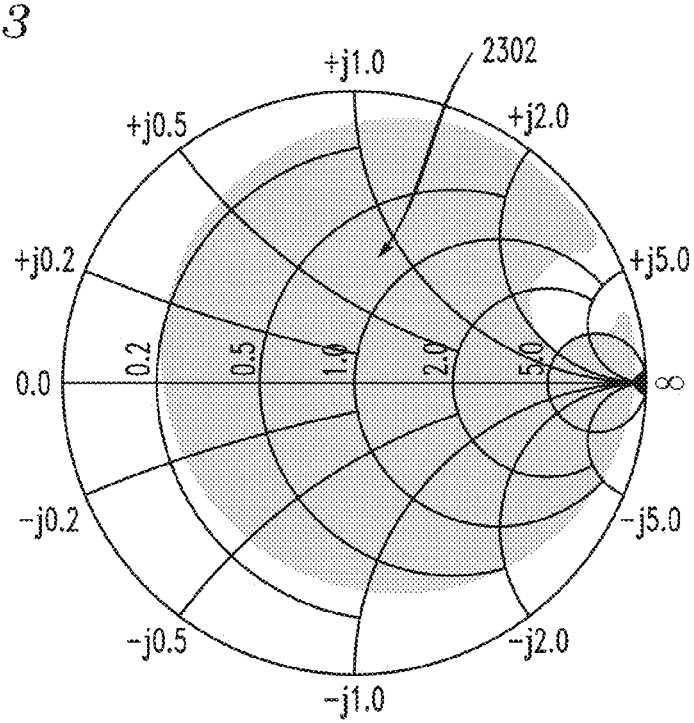

FIGS. 10A-D are schematic diagrams of illustrative switched reactance elements in accordance with described embodiments;

FIG. 11 is a schematic diagram of an illustrative phase-switched TMN employing a digitally-switched capacitance matrix;

FIG. 12 is a schematic diagram of an illustrative phase-switched TMN employing a digitally-switched inductance matrix;

FIG. 13 is a schematic diagram of an illustrative phase-switched TMN in accordance with described embodiments;

FIG. 14 is a Smith chart of a range of load impedances that can be matched by the tuning network of FIG. 13 for an illustrative operating range;

FIG. 15 is a schematic diagram of additional detail of the tuning network of FIG. 13;

FIG. 16 is a block diagram of an illustrative topology of a phase-switched impedance modulation amplifier in accordance with described embodiments;

FIG. 17 is a block diagram of another illustrative topology of a phase-switched impedance modulation amplifier in accordance with described embodiments;

FIGS. 18A-E are schematic diagrams of illustrative three-switch phase-switched impedance modulation amplifiers in accordance with described embodiments;

FIGS. 19 and 20 are schematic diagrams of illustrative two-switch phase-switched impedance modulation amplifiers in accordance with described embodiments;

FIG. 21 is a schematic diagram of an illustrative phase-switched impedance modulation amplifier over an illustrative operating range;

FIGS. 22 and 23 are Smith charts showing a range of load impedances that can be matched by the phase-switched impedance modulation amplifier of FIG. 21 for an illustrative operating range; and FIG. 24 is a flow diagram of an illustrative process of operating the TMN of FIG. 1.

DETAILED DESCRIPTION

Table 1 summarizes a list of acronyms employed throughout this specification as an aid to understanding the described embodiments:

TABLE 1

| CMOS | Complementary Metal-Oxide Semiconductor | CR | Cognitive Radio |
|---|---|---|---|
| FET | Field Effect Transistor | HEMT | High-Electron-Mobility Transistor |

TABLE 1-continued

| IC | Integrated Circuit | LUT | Look Up Table |
|---|---|---|---|
| MEMS | Micro-ElectroMechanical Systems | PA | Power Amplifier |
| PSIM | Phase-Switched Impedance Modulation | PS-TMN | Phase-Switched Tunable impedance Matching Network |
| RF | Radio Frequency | SDR | Software Defined Radio |
| TMN | Tunable impedance Matching Network | WPT | Wireless Power Transfer |
| ZCS | Zero Current Switching | ZVS | Zero Voltage Switching |

Described embodiments are directed toward tunable matching networks based upon phase-switched variable network reactance elements, referred to herein as phase-switched tunable matching networks (PS-TMNs). Such PS-TMNs provide rapid, high bandwidth, continuous impedance matching over a wide impedance range, while operating efficiently at high power levels without requiring high bias voltages or currents. Such PS-TMNs might be employed alone, or might also be employed in combination with other matching techniques such as discrete switched reactance banks.

Such PS-TMNs might be employed in a variety of reconfigurable and adaptive RF systems, for example, RF front ends for software-defined radio (SDR) and cognitive radio (CR) applications that operate over a wide range of frequency bands, at different bandwidths, and in accordance with a variety of communication standards. PS-TMNs might also be employed in other RF applications, such as drivers for RF plasma loads to compensate for rapid load variations, or in wireless power transfer (WPT) systems to compensate for impedance mismatches between the transmitter and receiver to maximize transferred power and/or efficiency.

Described embodiments also provide zero voltage switching (ZVS) radio frequency (RF) amplifiers, referred to herein as phase-switched impedance modulation (PSIM) amplifiers. Such PSIM amplifiers might employ a PS-TMN to operate over a large frequency range by efficiently modulating output power over a wide frequency range and/or matching into highly variable loads (e.g., loads that are variable over a wide impedance range).

Referring to FIG. 1, a radio frequency (RF) system 100 includes a phase-switched tunable impedance matching network (PS-TMN) 112 coupled between a source 102, having an impedance $Z_S$, and a load 114, having an impedance $Z_L$. In some applications, source 102, control circuit 106 and PS-TMN 112 (and other elements of RF system 100) are coupled to a power supply voltage (e.g., $V_{DC}$) and ground. Control circuit 106 is coupled to PS-TMN 112 and provides control signals to PS-TMN 112 so as to control operation of PS-TMN 112. In response to such control signals, PS-TMN 112 provides a desired impedance transformation characteristic. It should be appreciated that control circuit 106 might be an internal component to PS-TMN 112, or might be an external component coupled to PS-TMN 112 or some portions of control circuit 106 (or functions provided by control circuit 106 may be internal to PS-TMN 112 while other portions of control circuit 106 may be external to PS-TMN 112.

In some embodiments, control circuit 106 controls operation of PS-TMN 112 based, at least partially, upon information received from an optional feedforward circuit 104 coupled to source 102 and/or an optional feedback circuit 110 coupled to load 114. In some embodiments, optional feedforward circuit 104 includes adaptive predistortion circuit 107 and control circuit 106 includes look up table (LUT) 108. For example, as will be described in greater detail below, some embodiments might employ one or more non-linear control techniques (e.g., by control circuit 106) to determine appropriate control signals for PS-TMN 112, such as employing fixed or adaptable look-up tables (e.g., LUT 108) to store predetermined control signal information, feedback (e.g., by feedback circuit 110) and/or feedforward compensation (e.g., by feedforward circuit 104) to adaptively adjust control signal information, or performing digital predistortion of the control signals (e.g., by predistortion circuit 107), or other similar techniques.

PS-TMN 112 includes one or more phase-switched reactance elements 116(1)-116(N). As will be described in greater detail below, phase-switched reactance elements 116(1)-116(N) might be implemented using one or more capacitive elements (e.g., capacitors), one or more inductive elements (e.g., inductors), or a combination of both. Phase-switched reactance elements 116(1)-116(N) can be controlled to adjust the effective impedance ($Z_{S,IN}$ and $Z_{L,IN}$) presented to the terminals of PS-TMN 112 at a desired frequency. The phase-switched reactance elements 116(1)-116(N) are switched, for example by either a shunt or a series switch, and the effective impedance of the phase-switched reactance elements is controlled by adjusting the phase and/or duty-cycle of the shunt or series switch. In some embodiments, the desired frequency might be the RF frequency of operation of RF source 102 (e.g., the frequency of the signal provided from RF source 102 to PS-TMN 112).

By modulating the effective impedance at a desired frequency of operation of RF system 100 (e.g., by adjusting the impedance of phase-switched reactive elements 116(1)-116(N)), it is possible to adjust, tune, change or otherwise manipulate the impedance presented by PS-TMN 112 to source 102 and/or load 114. For example, phase-switched reactance elements 116(1)-116(N) allow PS-TMN 112 to present a desired impedance ($Z_{S,IN}$) to PS-TMN 112 from source 102 and a desired impedance ($Z_{L,IN}$) into PS-TMN 112 from load 114.

The control signals provided to PS-TMN 112 operate to control the timing of turning on and/or off the switches of phase-switched reactance elements 116(1)-116(N) with respect to the RF signal provided from source 102. The switching provides the effective reactance values of phase-switched reactance elements 116(1)-116(N) that effect the desired impedance transformation of PS-TMN 112. Feedforward information might include information about the effective input impedance of PS-TMN 112, the timing of RF waveforms, specified signal levels and/or impedance levels, etc. Feedback information might include measured information about the effective load impedance and/or power reflected from the load, the timing of RF waveforms, etc.

Thus, in some embodiments, PS-TMN 112 might be employed to provide a desired impedance transformation between source 102 and load 114. For example, PS-TMN 112 might provide an impedance match between source 102 and load 114. Alternatively, the impedance of PS-TMN 112 might be adjusted to compensate for variations in the impedance ($Z_L$) of load 114 such that source 102 is coupled to a more stable impedance (e.g., $Z_{S,IN}$) provided by PS-TMN 112.

Figure 2:
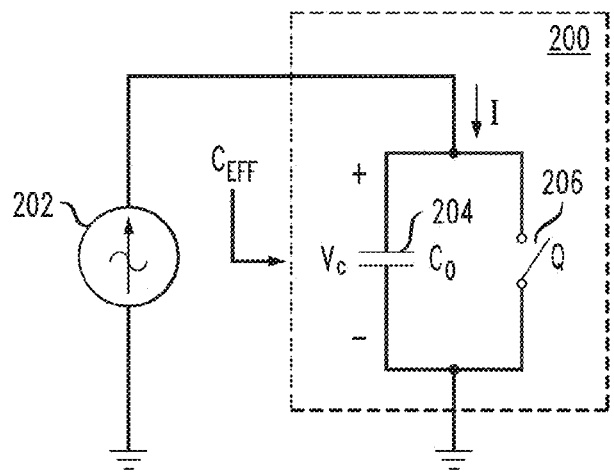
FIG. 2 is a schematic diagram of an illustrative phase-switched variable capacitance element of the TMN of FIG. 1.

Referring to FIG. 2, sinusoidal current source 202, having a current I, drives an illustrative phase-switched variable reactance 200. The phase-switched variable reactance is here shown as including a parallel combination of a capacitor 204 and switch 206 to provide the phase-switched variable reactance as phase-switched variable capacitance 200.

Capacitor 204 has a physical capacitance $C_0$, and a voltage $V_C$. The state of switch 206 is controlled by a characteristic of signal Q. For example, switch 206 provides a low impedance signal path between its terminals (e.g., switch 206 is "on" or "closed") when signal Q has a logic high value, and switch 206 provides a high impedance signal path between its terminals (e.g., switch 206 is "off" or "open") when signal Q has a logic low value. Thus, switch 206 could be considered to switch capacitor 204 into the circuit when the switch is open (current I flows into capacitor 204), and out of the circuit when the switch is closed (current I flows through the closed switch and bypasses capacitor 204).

If switch 206 is always off (open), then the effective capacitance, $C_{EFF}$, of phase-switched variable capacitance 200 presented to source 202 is equivalent to the physical capacitance, $C_0$, of capacitor 204. Alternatively, if switch 206 is always on (closed), then the low impedance path between the terminals of switch 206 effectively "shorts" capacitor 204, and phase-switched variable capacitance 200 behaves as an infinite capacitor in the sense that the voltage across capacitor 204 remains zero irrelevant of current I. The effective capacitance, $C_{EFF}$, of capacitor 204 can theoretically be controlled between $C_0$ and infinity by controlling the conduction angle of switch 206 over an AC cycle of sinusoidal current source 202 from 0 to $2\pi$. As used herein, a conduction angle is the angle of the sinusoidal signal at which switch 206 is turned on. The conduction angle with which the switch is turned on may be entirely determined by a switching signal Q (e.g., the switching angle) or partly determined by switching signal Q and partly by circuit waveforms such as voltage $V_C$ and current I.

Figure 3:
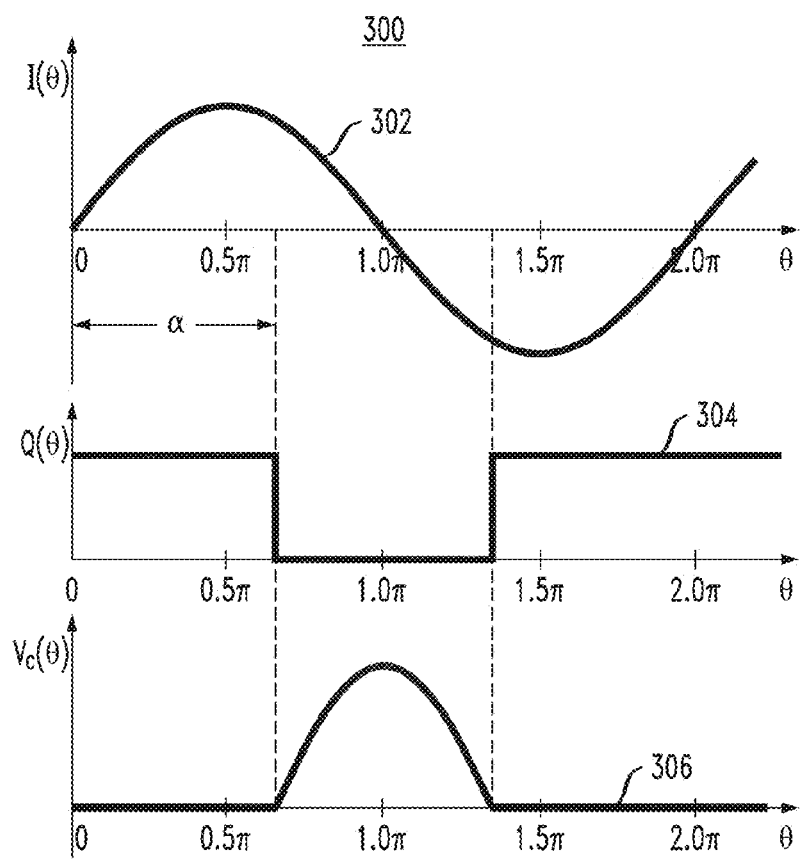
FIG. 3 is a plot of current and voltage versus phase with respect to a control signal of the phase-switched variable capacitance element of FIG. 2.

Referring to FIG. 3, illustrative waveforms of the current I and capacitor voltage $V_C$ (e.g., the voltage of capacitor 204) are shown with respect to the switch control signal, Q, as a function of a cycle angle θ. In particular, curve 302 shows I(θ), curve 306 shows $V_C$(θ) and curve 304 shows Q(θ) for a half-wave switched capacitor. As shown in FIG. 3, every cycle of I(θ), switch 206 is turned off (opened) α radians after I(θ) transitions from negative to positive (e.g., switch 206 is on/closed until α radians into the positive half-cycle of I(θ)). Switch 206 remains off (open) until after the capacitor voltage rings down to zero. Biasing the switch into its conductive state (e.g., turning the switch on or closing the switch) after the capacitor voltage rings down to zero ensures zero-voltage-switching (ZVS) turn on of switch 206.

If the switch includes a diode that naturally prevents the voltage from going negative, the timing of actively turning switch Q on may be relaxed, since it will naturally commutate "ON" when the switch voltage reaches zero and the active turn-on signal can be issued while the diode conducts. The capacitor $C_0$ across the switch provides snubbing of the turn off transition, providing zero-voltage-switching (ZVS) turn off of switch 206.

As shown in FIG. 3, when I(θ) is a purely sinusoidal current source, switch 206 remains off (open) until the conduction angle of the switch is reached (e.g., at 2α). Thus, for a half-wave switched capacitor, switch 206 is turned on and off once per cycle of the RF signal from source 102 (e.g., I(θ) as shown by curve 302).

Adjusting α sets where in the cycle switch 206 turns on and off (e.g., controls the conduction angle of switch 206) and hence controls the voltage at which the capacitor peaks. Thus, there is a relationship between the switching angle (α) and the magnitude of the fundamental component of $V_C$(θ) at the switching frequency. Consequently, the effective capacitance, $C_{EFF}$, of capacitor 204 can be represented as a function of α:

$$C_{EFF} = \frac{C_0 \cdot \pi}{\pi - \alpha + \sin(\alpha) \cdot \cos(\alpha)} \quad (1a)$$

Figure 4:
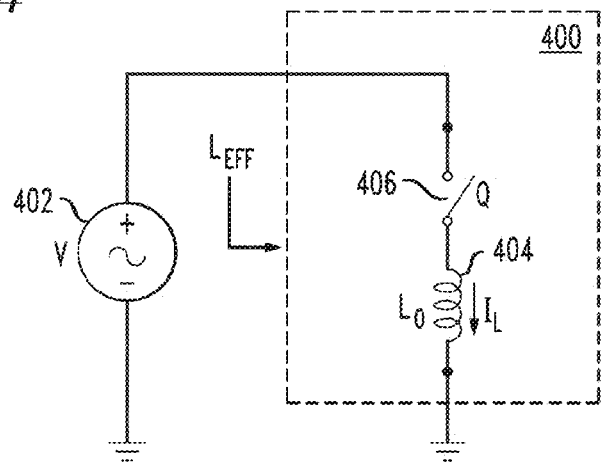
FIG. 4 is a schematic diagram of an illustrative phase-switched variable inductance element of the TMN of FIG. 1.

Referring to FIG. 4, it is also possible to implement a phase-switched variable reactance as a switched inductor network that allows continuous control of its effective inductance at the switching frequency. Such a switched inductor network is shown in FIG. 4 as phase-switched variable inductance 400 and corresponds to the topological dual of the switched capacitor network 200 shown in FIG. 2. As shown in FIG. 4, illustrative phase-switched variable inductance 400 includes a series combination of inductor 404 and switch 406 being driven by a sinusoidal voltage source 402 with a voltage V. Inductor 404 has a physical inductance $L_0$, and an inductor current $I_L$. The state of switch 406 is controlled by the signal Q, for example, switch 406 might be on (e.g., closed) when signal Q has a logic high value, and off (e.g., open) when signal Q has a logic low value. Thus, switch 406 could be considered to switch inductor 404 into the circuit when the switch is closed (applying voltage V to inductor 404), and out of the circuit when the switch is open (no voltage is applied to inductor 404).

Similarly to the switched-capacitor implementation of a phase-switched variable reactance described in regard to FIG. 2, the effective inductance $L_{EFF}$ of phase-switched variable inductance 400 at the switching frequency can be modulated from a base value $L_0$ to infinity. For example, if switch 406 is always on (closed), then the effective inductance, $L_{EFF}$, of phase-switched variable inductance 400 seen by source 402 is equivalent to the physical inductance, $L_0$, of inductor 404. Alternatively, if switch 406 is always off (open), then inductor 404 behaves as an infinite inductor in the sense that the current through inductor 404 remains zero irrelevant of voltage V. The effective inductance, $L_{EFF}$, of inductor 404 can ideally be controlled between $L_0$ and infinity by controlling the conduction angle of switch 406 over an AC cycle of sinusoidal voltage source 402 from 0 to $2\pi$.

Figure 5:
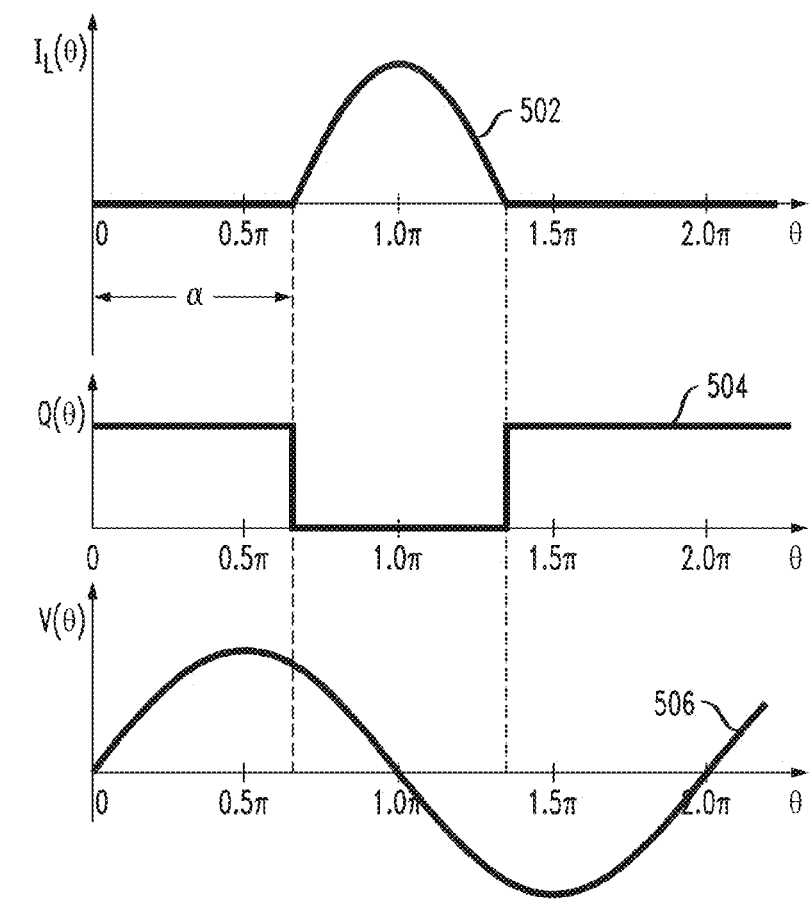
FIG. 5 is a plot of current and voltage versus phase with respect to a control signal of the phase-switched variable inductance element of FIG. 4.

Referring to FIG. 5, illustrative waveforms of the current I and voltage $V_C$ of capacitor 204 are shown with respect to the switch control signal, Q, as a function of a cycle angle θ. As a result of the properties of topological duality, the voltage waveform of the switched capacitor network shown in FIG. 3 is analogous to the current waveform of the switched inductor network shown in FIG. 5, and vice versa.

In particular, curve 502 shows $I_L$(θ), curve 506 shows V(θ) and curve 504 shows Q(θ) for a half-wave switched inductor. As shown in FIG. 5, every cycle of V(θ), switch 406 is turned on (closed) α radians after V(θ) transitions from negative to positive (e.g., switch 406 is off/open until α radians into the positive half-cycle of V(θ)). Switch 406 remains on (closed) until after the inductor current rings down to zero. Since the switch has an inductor in series with it, zero-current-switching (ZCS) turn on of the switch can be achieved. Turning the switch off at the time when the inductor current rings down to zero ensures zero-current-switching (ZCS) turn off of switch 406. In duality with the capacitive circuit, utilization of diode(s) as part of switch Q can enable natural commutation (turn off) of the switch and relax detailed active timing of the turn-off moment of the switching control waveform. As shown in FIG. 5, when V(θ) is a purely sinusoidal voltage source, switch 406 remains on (closed) until the conduction angle of the switch is reached (e.g., at 2α).

Adjusting α sets where in the cycle switch 406 turns on and off (e.g., controls the conduction angle of switch 406) and hence controls the current at which the inductor peaks. Thus, similarly to the switched-capacitor implementation of a phase-switched variable reactance described in regard to FIG. 2, there is a relationship between the switching angle (α) and the magnitude of the fundamental component of $I_L(\theta)$ at the switching frequency. Consequently, the effective inductance, $L_{EFF}$, of inductor 404 can be represented as a function of α:

$$L_{EFF} = \frac{L_0 \cdot \pi}{\pi - \alpha + \sin(\alpha) \cdot \cos(\alpha)} \quad (1b)$$

As a result of topological duality, expression (1b) for the effective inductance is the same as that of expression (1a) for the effective capacitance. Expression (1a) is consistent with the intuitive expectation for infinite effective capacitance when the switch is always in the on state (α=π) and predicts the equivalence between $C_{EFF}$ and $C_0$ when the switch is permanently off (α=0). Expression (1b) is similarly consistent with the intuitive expectation for infinite effective inductance when the switch is always in the off state (α=0) and predicts the equivalence between $L_{EFF}$ and $L_0$ when the switch is permanently on (α=π). Thus, in accordance with expressions (1a) and (1b), the effective capacitance $C_{EFF}$ or the effective inductance $L_{EFF}$ at the switching frequency can be modulated by controlling the conduction angle of the switch associated with the capacitor or inductor.

Figure 6:
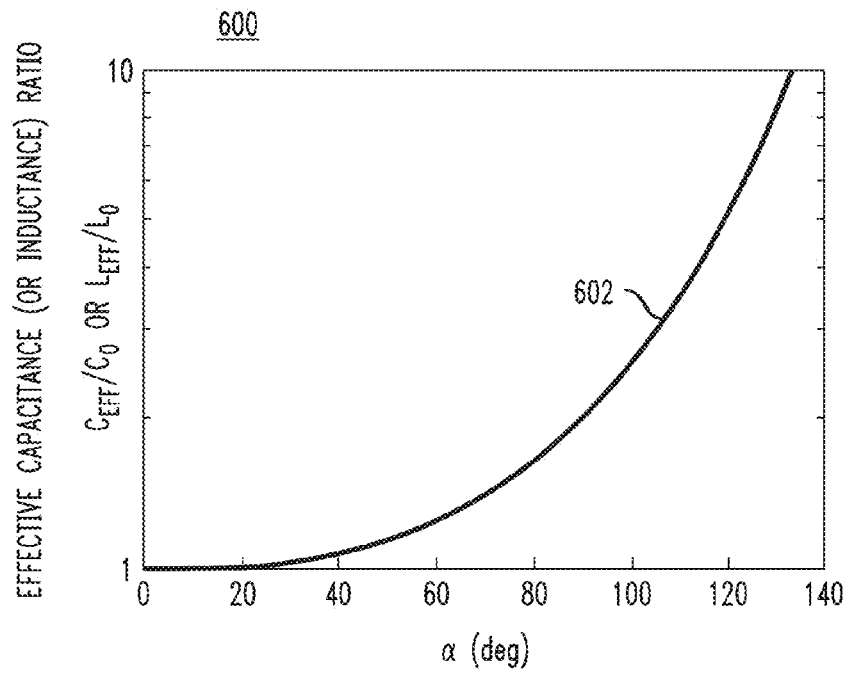
FIG. 6 is a plot of normalized effective capacitance (or inductance) of the phase-switched elements of FIGS. 2 and 4 versus a control angle of the phase-switched element.

Referring to FIG. 6, the normalized effective capacitance, $C_{EFF}/C_0$, or the normalized effective inductance $L_{EFF}/L_0$, is shown by curve 602 at the switching frequency. For the capacitive circuit this is the same thing as the normalized admittance $Y_{EFF}/Y_0$ while for the inductive circuit this is the same as the normalized reactance, $X_{EFF}/X_0$. As a result of topological duality, the normalized effective admittance $Y_{EFF}/Y_0$ of the phase-switched capacitor circuit of FIG. 2 is the same as the normalized reactance, $X_{EFF}/X_0$ of the phased-switched inductor network shown in FIG. 4.

As shown in FIG. 6, the normalized effective capacitance $C_{EFF}$ (or inductance $L_{EFF}$) increases rapidly with α and approaches infinity as α approaches π (e.g., 180 degrees).

Figure 7:
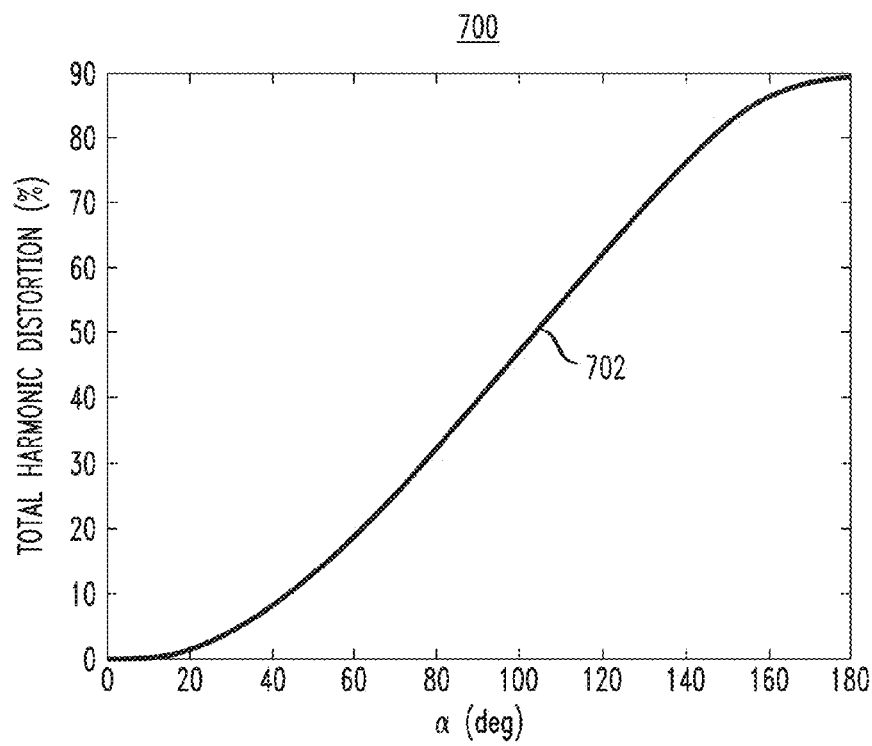
FIG. 7 is a plot of total harmonic distortion of the phase-switched elements of FIGS. 2 and 4 versus the control angle of the phase-switched element.

Referring to FIG. 7, curve 702 shows the total harmonic distortion of the capacitor voltage (inductor current) versus α for a purely sinusoidal current (voltage) excitation source. The practical range over which $C_{EFF}$ or $L_{EFF}$ can be modulated depends on the amount of harmonic distortion that can be present in the network. As α increases towards π (e.g., the conduction angle of the switch increases), the ringing of the capacitor voltage $V_C$ (e.g., curve 306) or of the inductor current $I_L$ (e.g., curve 502) is limited to a shorter time period. As shown in FIG. 7, this results in significant harmonic content of the capacitor voltage for large $Y_{EFF}/Y_0$ or $X_{EFF}/X_0$ (e.g., $C_{EFF}/C_0$ or $L_{EFF}/L_0$) ratios (e.g., the total harmonic distortion increases as α increases). The amount of harmonic distortion allowed in a given system depends on specified limits of harmonic content allowed into the source and/or load and the amount of filtering that is necessary or desired.

Note that FIG. 7 shows the harmonic distortion of the phase-switched variable reactance (e.g., the harmonic distortion of the capacitor voltage of phase-switched variable capacitance 200, or the harmonic distortion of the inductor current of phase-switched variable inductance 400), and not the harmonic content that is actually injected into the source and/or load of the RF system (e.g., source 102 and load 114). In some embodiments, the phase-switched variable reactance (e.g., phase-switched variable capacitance 200 or phase-switched variable inductance 400) includes additional filtering components (not shown in FIGS. 2 and 4) to reduce harmonic content injected into the source and/or load (e.g., source 102 and load 114).

As described in regard to FIGS. 3 and 5, the phase-switched variable reactance (e.g., phase-switched variable capacitance 200 or phase-switched variable inductance 400), are half-wave switched, where the switch is operated so that the capacitor voltage (curve 306 of FIG. 3) and inductor current (curve 502 of FIG. 5) are unipolar. However, other switching schemes are also possible. For example, FIGS. 8 and 9 show illustrative waveforms of the current I and voltage V with respect to the switch control signal, Q, as a function of a cycle angle θ, for the switched capacitor network shown in FIG. 3 and the switched inductor network shown in FIG. 5, respectively.

Figure 8:
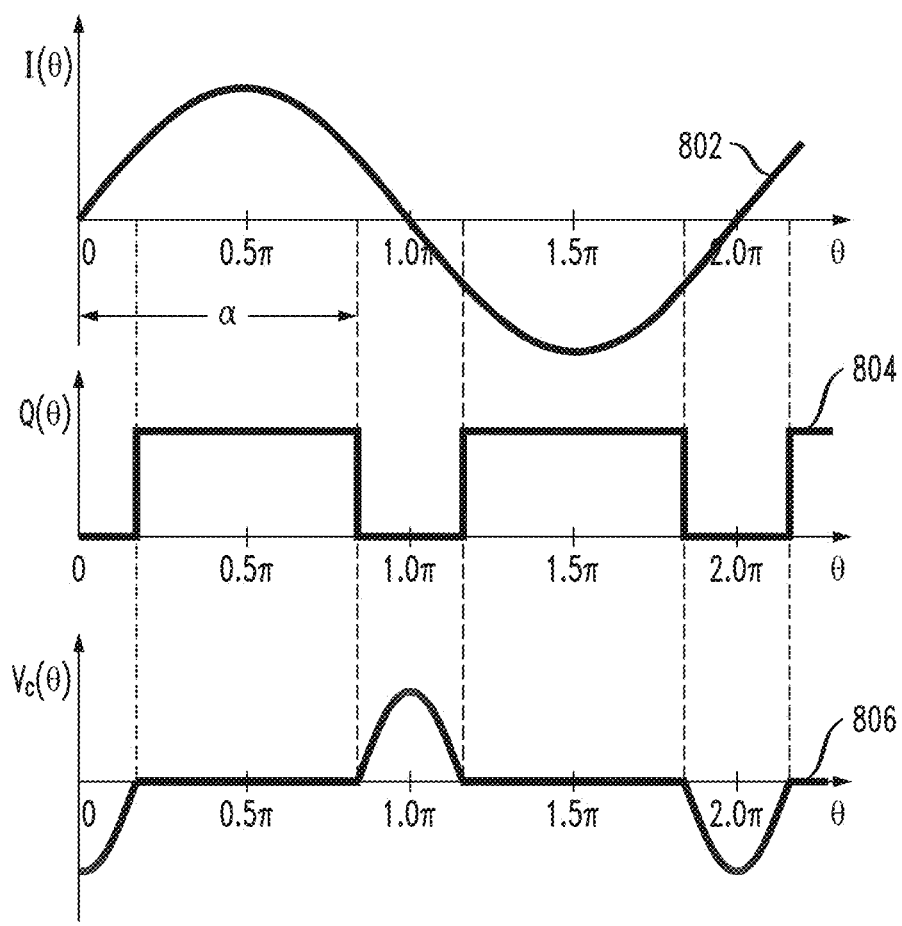
FIG. 8 is a plot of current and voltage versus phase with respect to a control signal of a full-wave switched variable capacitance element.
Figure 9:
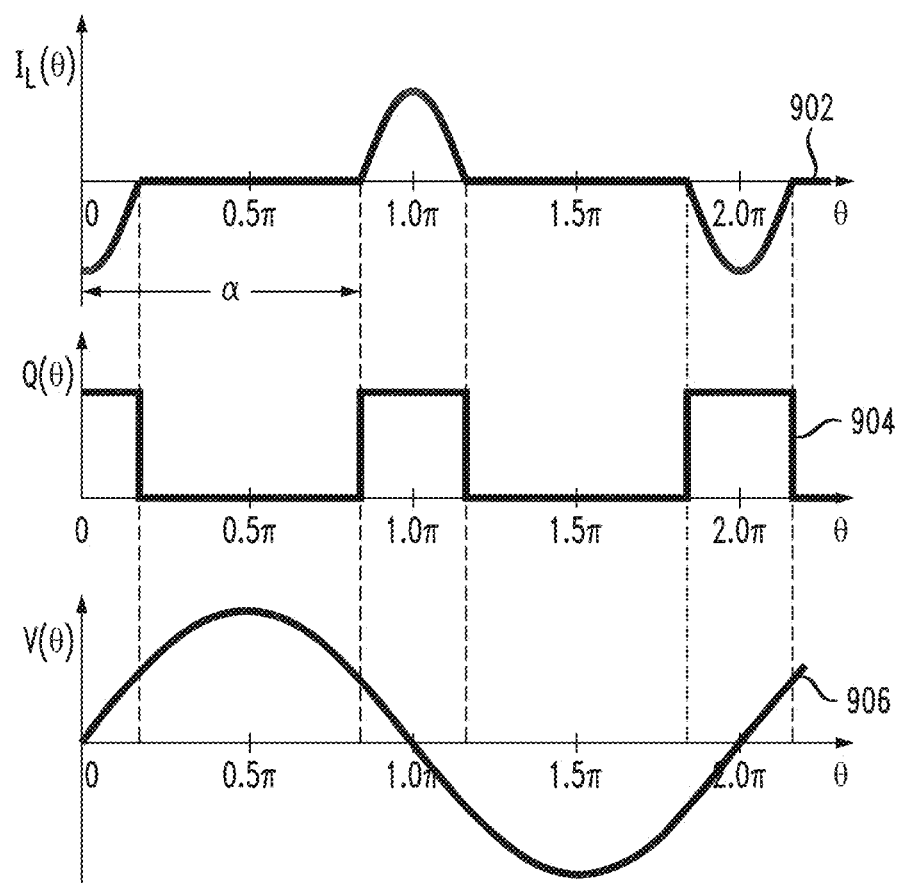
FIG. 9 is a plot of current and voltage versus phase with respect to a control signal of a full-wave switched variable inductance element.

In particular, as shown in FIG. 8, curve 802 shows I(θ), curve 806 shows $V_C(\theta)$ and curve 804 shows Q(θ) for a full-wave switched capacitor. As shown in FIG. 9, curve 902 shows $I_L(\theta)$, curve 906 shows V(θ) and curve 904 shows Q(θ) for a full-wave switched inductor. When phase-switched variable capacitance 200 is full-wave switched, the switch (e.g., switch 206) is turned off twice every cycle of I(θ) (e.g., Q(θ) is zero), with the off periods being centered around the instants when the current I(θ) is zero. For a purely sinusoidal excitation current I(θ), this results in a bipolar capacitor voltage waveform $V_C(\theta)$. Capacitor voltage $V_C(\theta)$ has zero DC average value. Similarly, when phase-switched variable inductance 400 is full-wave switched, the switch (e.g., switch 406) is turned on twice every cycle of V(θ) (e.g., Q(θ) has a logic high value), with the on periods being centered around the instants when the voltage V(θ) is zero. For a purely sinusoidal excitation voltage V(θ), this results in a bipolar inductor current waveform $I_L(\theta)$, which also has zero DC average value. Thus, for a full-wave switched capacitor (or inductor), switch 206 is turned on and off twice per cycle of the RF signal from source 102 (e.g., I(θ) as shown by curve 802).

As with half-wave switching (e.g., as shown in FIGS. 3 and 5), the effective capacitance $C_{EFF}$ and the effective inductance $L_{EFF}$ at the switching frequency can be modulated by controlling the switching angle, α, of the switch. The effective capacitance, $C_{EFF}$, of capacitor 204 can be represented as a function of α for a full-wave switched capacitor:

$$C_{EFF} = \frac{C_0 \cdot \pi}{2 \cdot [\pi - \alpha + \sin(\alpha) \cdot \cos(\alpha)]} \quad (2a)$$

Similarly, the effective inductance, $L_{EFF}$, of inductor 404 can be represented as a function of α:

$$L_{EFF} = \frac{L_0 \cdot \pi}{2 \cdot [\pi - \alpha + \sin(\alpha) \cdot \cos(\alpha)]} \quad (2b)$$

Thus, the effective capacitance/inductance that can be achieved for a given switching angle, α, with full-wave switched networks (e.g., relationships (2a) and (2b)) is half the effective capacitance/inductance that can be achieved with half-waved switched networks (e.g., relationships (1a) and (1b)). However, full-wave switched networks inherently result in reduced harmonic content of the capacitor voltage and inductor current compared to half-wave switched networks for the same switching angle, α (i.e the switching angle which controls the total switch conduction angle). On the other hand, implementing full-wave switching requires the switch has to operate at twice the operating frequency (e.g., to switch twice per cycle). Further, for capacitive modulation, bidirectional blocking switches are required, which can complicate switch implementation with typical semiconductor switches.

Relationships (1) and (2) above show that the effective capacitance and inductance for the switched networks shown in FIGS. 2 and 4 can be based upon the switching angle, α, for a purely sinusoidal excitation signals. For excitation signals that are not purely sinusoidal, the effective reactance can be controlled by appropriately selecting the timing or switching angle, α, at which the switch turns off (or on) although relationships (1) and (2) cannot calculate an exact value of α. Together with the circuit waveforms that determine zero-voltage (or zero current) points (for switch turn on (or off), switching angle α determines the total conduction angle of the switch during the cycle. For excitation signals that are not purely sinusoidal, an adaptable look-up table (e.g., LUT 108), feedback circuit 110 or feedforward circuit 104 (including optional digital predistortion circuit 107) might be employed to determine the required value of α for a given desired effective reactance.

Phase-switched variable capacitance 200 and phase-switched variable inductance 400 can be employed as building blocks for implementing phase-switched variable reactances and other adjustable circuits such as TMNs. Particularly, some applications could benefit substantially from variable reactances whose value can be controlled over a range spanning both capacitive and inductive reactances, and/or by modulating the effective reactance over a more limited range. Augmenting phase-switched variable capacitance 200 and/or phase-switched variable inductance 400 with additional reactive components can provide a wider range of variable reactances.

FIGS. 10A-10D show illustrative embodiments of phase-switched reactance circuits that include both capacitive and inductive elements, thereby expanding a range over which the impedance of the phase-switched reactance circuit can be tuned as compared to the single-element circuits shown in FIGS. 2 and 4.

Figure 10D:
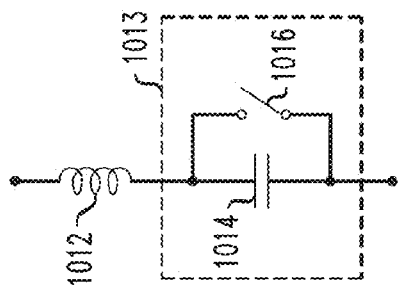
Figure 10C:
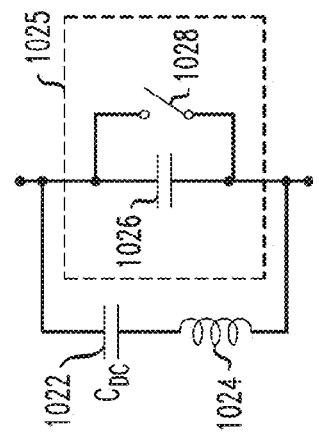
Figure 10B:
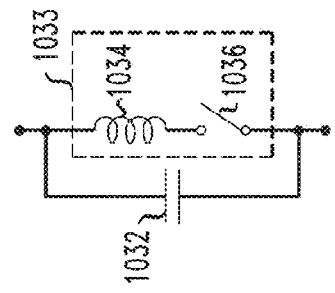
Figure 10A:
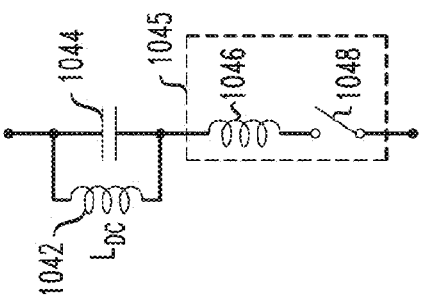

For example, FIG. 10A shows phase-switched reactance circuit 1002 that includes inductor 1012 in series with phase-switched capacitor 1013. Phase-switched capacitor 1013 includes switch 1016 in parallel with capacitor 1014, similarly as described in regard to FIG. 2. FIG. 10B shows phase-switched reactance circuit 1004 that includes inductor 1024 in series with capacitor 1022, with the series combination of inductor 1024 and capacitor 1022 arranged in parallel with phase-switched capacitor 1025. Capacitor 1022 is not phase-switched and, thus, is shown as $C_{DC}$. Phase-switched capacitor 1025 includes switch 1028 in parallel with capacitor 1026, similarly as described in regard to FIG. 2. FIG. 10C shows phase-switched reactance circuit 1006 that includes capacitor 1032 in parallel with phase-switched inductor 1033. Phase-switched inductor 1033 includes switch 1036 in series with inductor 1034, similarly as described in regard to FIG. 4. FIG. 10D shows phase-switched reactance circuit 1008 that includes inductor 1042 in parallel with capacitor 1044, with the parallel combination of inductor 1042 and capacitor 1044 arranged in series with phase-switched capacitor 1045. Inductor 1042 is not phase-switched and, thus, is shown as $L_{DC}$. Phase-switched inductor 1045 includes switch 1048 in series with inductor 1046, similarly as described in regard to FIG. 4.

As would be understood by one of skill in the art, circuit variants other than the ones illustrated in FIGS. 10A-10D are also possible. For example, placing a capacitor in series with a phase-switched capacitor provides a net effective impedance having a maximum capacitance equal to the series combination of the capacitor and the physical capacitance of the phase-switched capacitor, and a minimum capacitance equal to the series combination of the capacitor and the phase-switched capacitance value.

As described in regard to FIGS. 6 and 7, a tradeoff exists for phase-switched variable capacitance 200 and phase-switched variable inductance 400 between their variable reactance range and the amount of harmonic content injected into the rest of the system. In other words, the range over which the effective reactance can be controlled is limited by the amount of harmonic content that can be tolerated within the system (e.g., by source 102 and/or load 114). Some embodiments might employ additional or external filtering components to reduce harmonic content injected to source 102 and/or load 114. However, in some embodiments, it might not be possible to employ additional filtering components.

Referring to FIGS. 11 and 12, in cases where additional filtering components are not employed, the harmonic content can be reduced by combining phase-switched variable capacitance 200 and phase-switched variable inductance 400 with one or more digitally controlled capacitor or inductor matrices that are not phase-switched. Such hybrid switched networks include an RF switch operated at the RF frequency of operation and with controlled phase and duty cycle with respect to the RF waveform. The hybrid switched network also includes digital switches associated with one or more capacitors or inductors in the switched matrix. The digital switches are typically operated at a much lower frequency than the RF frequency, but could be operated up to the RF frequency (e.g., on a cycle-by-cycle basis) determined by the control bandwidth of the effective reactance $C_{EFF}$ or $L_{EFF}$.

Referring to FIG. 11, hybrid switched network 1100 includes a phase-switched reactance (e.g., capacitor $C_0$ 1116 and parallel switch 1118) and digitally controlled capacitor network 1102. Although shown as a phase-switched variable capacitance (e.g., capacitor $C_0$ 1116 and parallel switch 1118) coupled in parallel with digitally controlled capacitor network 1102 and load 114, in other embodiments, the phase-switched reactance might be implemented as a phase-switched variable inductance (e.g., such as shown in FIG. 4) coupled in series with digitally controlled capacitor network 1102 and load 114, or as one of the phase-switched reactance circuits shown in FIGS. 10A-D, or other equivalent circuits.

Digitally controlled capacitor network 1102 includes a plurality of capacitors and associated switches, shown as capacitors 1104, 1108, and 1112, and switches 1106, 1110, and 1114. In some embodiments, each of capacitors 1104, 1108, and 1112 have a unique capacitance value, allowing the capacitance value of digitally controlled capacitor network 1102 to be varied across a large capacitance range. For example, as shown in FIG. 11, capacitors 1104, 1108, and 1112 might increase from the phase-switched capacitor base value (e.g., $C_0$) in increments of $C_0$ until reaching a maximum capacitance value (e.g., $(2 \cdot 2^N-1) \cdot C_0$), where N is the number of capacitors in digitally controlled capacitor network 1102).

Switches 1106, 1110, and 1114 are coupled in series with corresponding ones of capacitors 1104, 1108, and 1112 and are operable to adjust the capacitance of digitally controlled capacitor network 1102 by connecting (or disconnecting) the respective capacitors. Switches 1106, 1110, and 1114 might operate based upon one or more control signals from control circuit 106. As described, switches 1106, 1110, and 1114 generally operate at a frequency less than the RF frequency to adjust the capacitance value of digitally controlled capacitor network 1102.

Referring to FIG. 12, hybrid switched network 1200 includes a phase-switched reactance (e.g., inductor $L_0$ 1216 and series switch 1218) and digitally controlled inductor network 1202. Although shown as a phase-switched variable inductance (e.g., inductor $L_0$ 1216 and series switch 1218) coupled in series with digitally controlled inductor network 1202 and in parallel with load 114, in other embodiments, the phase-switched reactance might be implemented as a phase-switched variable capacitance (e.g., such as shown in FIG. 2), or as one of the phase-switched reactance circuits shown in FIGS. 10A-D, or other equivalent circuits.

Digitally controlled inductor network 1202 includes a plurality of inductors and associated switches, shown as inductors 1206, 1210, and 1214, and switches 1204, 1208, and 1212. In some embodiments, each of inductors 1206, 1210, and 1214 have a unique inductance value, allowing the inductance value of digitally controlled inductor network 1202 to be varied across a large inductance range. For example, as shown in FIG. 12, inductors 1206, 1210, and 1214 and 1218 might increase from the phase-switched inductor base value (e.g., $L_0$) by increments of $L_0$ until reaching a maximum inductance value.

Switches 1204, 1208, and 1212 are coupled in parallel with corresponding ones of inductors 1206, 1210, and 1214 and are operable to adjust the inductance of digitally controlled inductor network 1202 by connecting (or shorting, e.g., providing a low-impedance path to bypass the inductor) the respective inductors. Switches 1204, 1208, and 1212 might operate based upon one or more control signals from control circuit 106. As described, switches 1204, 1208, and 1212 generally operate at a frequency less than the RF frequency to adjust the capacitance value of digitally controlled inductor network 1202.

Digitally controlled capacitor network 1102 and digitally controlled inductor network 1202 expand the range over which the reactance of the phase-switched reactance (e.g., capacitor $C_0$ 1116 and parallel switch 1118, or inductor $L_0$ 1216 and series switch 1218) can be continuously varied without introducing excessive harmonic content to source 102 and/or load 114. For example, the embodiments shown in FIGS. 11 and 12 employ digitally controlled capacitor network 1102 (or digitally controlled inductor network 1202) to control the base value $C_0$ (or $L_0$) of the switched networks 1100 (or 1200). The switch of the phase-switched reactance (e.g., switch 1118 or switch 1218) can be operated to step-up the base capacitance $C_0$ (or inductance $L_0$) by a factor determined by relationships (1) and (2) described above.

For example, the effective capacitance $C_{EFF}$ at the switching frequency of hybrid switched capacitor network 1100 can be controlled between a lower capacitance vale $C_0$ and an upper capacitance value by half-wave switching the RF switch with the switching angle, $\alpha$, varying from 0 to approximately $\pi/2$ as shown in FIG. 3. As shown in FIG. 7, RF switch operation with a switching angle, $\alpha$, less than $\pi/2$ (90 degrees) corresponds to a peak harmonic distortion of less than approximately 35%. Thus, the hybrid switched networks (e.g., 1100 and 1200) allow continuous control of the effective reactance at the switching frequency over a wide capacitive (or inductive) range with minimum harmonic distortion and without the need for adjustable bias voltages or currents.

In various embodiments, the RF switch of TMN 112 (e.g., switch 206 or switch 406) can be implemented as one of or a combination of various types of switching elements, for example based upon the RF frequency or other operating parameters of RF system 100. For example, lateral or vertical FETs, HEMTs, thyristors, diodes, or other similar circuit elements might be employed.

Phase-switched variable capacitance 200 and phase-switched variable inductance 400 can be employed as circuit elements within more complex phase-switched tunable matching networks (PS-TMNs), for example a Pi-network topology PS-TMN (Pi-TMN), although other network topologies are possible, such as L-networks, T-networks, or other similar networks. FIG. 13 shows a schematic of illustrative RF system 1300 including an RF source 1301 coupled to Pi-TMN 1302, which is coupled to an RF load 1303. Pi-TMN 1302 includes two variable shunt capacitive susceptances $B_1$ 1310 and $B_2$ 1314. In illustrative embodiments, RF source 1301 is commonly a power amplifier or the output of another RF system. As shown in FIG. 13, RF source 1301 can be represented by its Norton equivalent circuit as including current source 1304 in parallel with source resistance $R_S$ 1306 and source susceptance $B_S$ 1308. Similarly, RF load 1303 can be represented as including load resistance $R_L$ 1318 in parallel with load susceptance $B_L$ 1316. The source and load impedances, $Z_S$ and $Z_L$, respectively, can be expressed as:

$$Z_S = (R_S^{-1} + jB_S)^{-1} \tag{3}$$

$$Z_L = (R_L^{-1} + jB_L)^{-1} \tag{4}.$$

Thus, it can be shown that the susceptances $B_1$ and $B_2$ required to match the load impedance $Z_L$ to the source impedance $Z_S$ are given by:

$$B_1 = \frac{R_S \pm \sqrt{R_L R_S - X^2}}{X} - B_S \tag{5}$$

$$B_2 = \frac{R_S}{R_L}\left(\frac{R_S \pm \sqrt{R_L R_S - X^2}}{X}\right) - B_L. \tag{6}$$

Thus, Pi-TMN 1302 can be employed to match load impedance $Z_L$ to source impedance $Z_S$ by adjusting the values of variable shunt capacitive susceptances $B_1$ 1310 and $B_2$ 1314.

As shown in FIG. 13, embodiments of Pi-TMN 1302 include two variable shunt capacitive susceptances $B_1$ 1310 and $B_2$ 1314, and a fixed inductive reactance X 1312, although numerous other implementations of a Pi-TMN are possible, such as employing variable shunt inductive susceptances and a fixed capacitive reactance, implementing all three reactive branches as variable components, etc. It should, of course, be appreciated that is also possible to realize an L-section TMN having one variable shunt-path element and one variable series-path element. Other types of networks, might also be employed. As described in greater detail below, ground-referenced variable capacitors are highly suitable for realization with phase-switched variable reactance networks at RF frequencies.

Referring to FIG. 14, an illustrative range of load impedances that can be matched by Pi-TMN 1302 is shown as shaded region 1402 in Smith chart plot 1400 (normalized to $R_S$). For example, the impedance values represented by shaded region 1402 might be achieved by an illustrative Pi-TMN having $X=R_S$ and susceptance $B_1$ variable over a range of $1/R_S$ to $4/R_S$, and susceptance $B_2$ variable over a range of $1/R_S$ to $Z/R_S$. As shown in FIG. 14, Pi-TMN 1302 is able to match the impedance of RF source 1301 to a load impedance that varies over approximately a 10:1 resistance range and a 5:1 reactance range (both capacitively and inductively). To do so, Pi-TMN 1302 modulates $B_1$ over a 1:4 range and $B_2$ over a 1:2 range, which can be achieved employing a phase-switched variable reactance network such as shown in FIGS. 2 and 4.

FIG. 15 shows an illustrative embodiment of phase-switched Pi-TMN circuit 1502 to achieve the matching range shown in FIG. 14 for a source impedance (e.g., $R_S$ 1506) of 50Ω. The inductive reactance X is chosen to be equivalent in value to the Norton-equivalent source resistance $R_S$ (e.g., 50Ω). As shown in FIG. 15, the variable capacitive susceptances $B_1$ and $B_2$ are implemented as half-wave phase-switched capacitors (e.g., phase-switched capacitor 200 of FIG. 2). Variable capacitive susceptance $B_1$ includes phase-switched capacitor $C_{P2}$ 1514 and FET switch 1512, which is controlled by switching control signal q2, which has a switching angle, α2. Variable capacitive susceptance $B_2$ includes phase-switched capacitor $C_{P1}$ 1520 and FET switch 1522, which is controlled by switching control signal q1, which has a switching angle, $α_1$.

In an illustrative embodiment, phase-switched Pi-TMN circuit 1502 operates at 27.12 MHz and is capable of matching a 50Ω source impedance to a load impedance that varies over approximately a 10:1 resistance range and a 5:1 reactance range (both capacitively and inductively), by properly adjusting the switching angles ($α_1$ and $α_2$) of the switches and the phase shift between them (e.g., by adjusting switching control signals q1 and q2).

Implementing variable capacitive susceptances $B_1$ and $B_2$ as half-wave FET-switched capacitor networks provides zero-voltage-switched (ZVS) operation of the switches, and allows each variable reactance to be implemented with a single, ground-referenced switch (e.g., FET 1512 for variable capacitive susceptance $B_1$ and FET 1522 for variable capacitive susceptance $B_2$). ZVS operation is desired in switched systems as it reduces switching power loss and improves the overall system efficiency. Furthermore, the output (drain-to-source) capacitance of FETs 1512 and 1522 are in parallel with phase-switched capacitors $C_{P1}$ and $C_{P2}$ and, thus can be added to the shunt capacitances and utilized as part of the TMN.

In illustrative Pi-TMN circuit 1502, inductive reactance X 1312 shown in FIG. 13 is implemented as a series-resonant circuit including inductor $L_{S2}$ 1516 and capacitor $C_{S2}$ 1518 disposed in series between variable susceptances $B_1$ and $B_2$, which are disposed as shunt elements (e.g., coupled to ground). Inductor $L_{S2}$ 1516 and capacitor $C_{S2}$ 1518 are selected to have an inductive impedance approximately equal to the source impedance (e.g., 50Ω) at the desired frequency.

In the embodiment shown in FIG. 15, two additional series-resonant circuits are included, one as an input filter and one as an output filter of Pi-TMN circuit 1502 to limit the amount of harmonic content injected into the source and the load as a result of the switching. For example, capacitor $C_{S1}$ 1508 and inductor $L_{S1}$ 1510 act as a series-resonant input filter between source 1504 and Pi-TMN circuit 1502. Similarly, inductor $L_{S3}$ 1524 and capacitor $C_{S3}$ 1526 act as a series-resonant output filter between load 1528 and Pi-TMN circuit 1502.

The quality factor, Q, of the series-resonant circuit of $L_{S2}$ 1516 and $C_{S2}$ 1518 controls the interaction between phase-switched capacitor $C_{P1}$ 1520 and phase-switched capacitor $C_{P2}$ 1514. For example, increasing the quality factor Q (e.g., by increasing the values of $L_{S2}$ 1516 and $C_{S2}$ 1518) reduces the interaction between phase-switched capacitor $C_{P1}$ 1520 and phase-switched capacitor $C_{P2}$ 1514, although increasing the quality factor Q also reduces the effective bandwidth of the network.

For example, for phase-switched Pi-TMN circuit 1502 to achieve the matching range shown in FIG. 14 for a source impedance (e.g., $R_S$ 1506) of 50Ω at an illustrative desired frequency in the range of about 27 MHz, phase-switched capacitor $C_{P1}$ 1520 might have a physical value, $C_0$, of 130 pF, and phase-switched capacitor $C_{P2}$ 1514 might have a physical value, $C_0$, of 100 pF. To achieve the desired quality factor Q by the series-resonant circuit between phase-switched capacitor $C_{P1}$ 1520 and phase-switched capacitor $C_{P2}$ 1514, capacitor $C_{S2}$ 1518 might have a value of 0.01 pF, and inductor $L_{S2}$ 1516 might have a value of 297 nH. To achieve the desired input and output filtering by the series-resonant circuits, capacitors $C_{S1}$ 1508 and $C_{S3}$ 1526 might have a value of 23.4 pF, and inductors $L_{S1}$ 1510 and $L_{S3}$ 1524 might have a value of 1.47 μH. Further, FETs 1512 and 1522 might have an on-state resistance of 10 mΩ, and the body diode of each FET might have a forward voltage of 0.4V and an on-state resistance of 10 mΩ.

Switching of FETs 1512 and 1522 is synchronized to their drain current based upon the switching angle α, which is based upon the desired effective capacitance of capacitors $C_{P1}$ and $C_{P2}$. As described above for half-wave phase-switched capacitors, FETs 1512 and 1522 are turned off after their drain current crosses from negative to positive, and then turned on again once their respective drain voltages ring down to zero. The appropriate value of α for each of FETs 1512 and 1522 can be calculated by determining the required $B_1$ and $B_2$ susceptances for a desired load impedance $Z_L$ as given by relationships (5) and (6). Once each capacitive susceptance $B_1$ and $B_2$ is known, that value can be plugged in as $C_{EFF}$ ($C_0$ is a known value as the physical capacitance of the capacitor) in relationship (1a) (for a half-wave phase-switched capacitor) or relationship (2a) (for a full-wave phase-switched capacitor) to determine values of α that correspond to the desired susceptance values.

As described, for phase-switched networks having non-purely sinusoidal current excitation, relationships (1) and (2) might not result in an exact value of α to achieve the desired susceptance. Further, nonlinearity of the drain-to-source switch capacitances and the mutual interaction of the two switched networks (e.g., capacitive susceptances $B_1$ and $B_2$) might also result in inaccurate calculation of α. Thus, some embodiments employ non-linear control techniques (e.g., by control circuit 106) to determine the appropriate values of α, such as fixed or adaptable look-up tables (e.g., LUT 108), feedback (e.g., by feedback circuit 110), feedforward compensation (e.g., by feedforward circuit 104), digital predistortion of the switching angles (e.g., by predistortion circuit 107), or other similar techniques.

To set the correct value of switching control parameter α for each of FETs 1512 and 1522 for Pi-TMN circuit 1502 to achieve a given impedance, LUT 108 might store predetermined switching angles (e.g., $α_1$ and $α_2$) corresponding to various load impedances. For example, table 2 shows an illustrative list of possible load impedances that Pi-TMN circuit 1502 can match to a 50Ω source and the corresponding values of switching angles $\alpha_1$ and $\alpha_2$ for the switch control signals q1 and q2:

TABLE 2

| Load Impedance $Z_L$ (Ω) | $\alpha_1$ (degrees) | $\alpha_2$ (degrees) |
|---|---|---|
| 48.8 + 10.90j | 0.0 | 0.0 |
| 103 + 8.12j | 78.1 | 95.7 |
| 165 − 0.923j | 87.9 | 91.8 |
| 282 + 3.20j | 97.6 | 85.9 |
| 524 − 19.30j | 107.0 | 79.1 |
| 1000 + 15.90j | 117.0 | 72.2 |

Table 2 shows that it is possible for Pi-TMN circuit 1502 to match a 50Ω source impedance to a load impedance that varies resistively over at least a factor of 10:1. Based upon the switching angles ($\alpha_1$ and $\alpha_2$) listed table 2 and the plot of effective reactance (e.g., $C_{EFF}/C_0$ or $L_{EFF}/L_0$) versus α shown in FIG. 6, it can be shown a 2:1 modulation of the effective capacitances can achieve impedance matching for a load impedance varying resistively over a 10:1 range.

Other types of systems can also employ the phase-switched networks described herein. For example, a wide range of systems can benefit from an RF power amplifiers (PA) that deliver power at a particular frequency or over a particular band of frequencies. Such PAs might beneficially control output power over a wide range and maintain high efficiency across its operating range. Conventional linear amplifiers (e.g., class A, B, AB, etc.) offer the benefits of wide-range dynamic output power control and high fidelity amplification, but have limited peak efficiency that degrades rapidly with power back-off. On the other hand, switching PAs (e.g., inverters such as class D, E, F, Φ, etc.), offer high peak efficiency, but only generate constant envelope signals (at a constant supply voltage) while remaining in switched mode.

One technique for output power control in a switching PA is through load modulation, where the load of the PA is modulated by an external network. In described embodiments, the load of the PA is modulated by a phase-switched tunable matching network (TMN) (e.g., a network including one or more phase-switched variable capacitances 200 or phase-switched variable inductances 400, such as Pi-TMN circuit 1502). For example, an impedance transformation of a phase-switched TMN might control the output power of a PA.

Referring to FIG. 16, such a phase-switched impedance modulation (PSIM) amplifier is shown as PSIM amplifier 1600. PSIM amplifier 1600 includes RF power amplifier (or inverter) 1602 that generates RF power at a particular frequency, or over a particular range of frequencies. RF PA 1602 is coupled to a power supply (e.g., voltage $V_{DC}$ and ground) and phase-switched TMN 1604. Phase-switched TMN 1604 is coupled to RF load 1606, which has a load impedance $Z_L$. Phase-switched TMN 1604 is coupled to controller 1608, which controls operation of the TMN, for example by providing control signals to switches of the TMN based upon the switching angles (e.g., a) to achieve a desired impedance. Although not shown in FIG. 16, in some embodiments, controller 1608 is coupled to RF PA 1602 and also controls operation of the PA. Phase-switched TMN 1604 adaptively controls transforming the load impedance $Z_L$ to an impedance presented to PA 1602. For example, phase-switched TMN 1604 may control the output power of PA 1602 by modulating the load presented to PA 1602 (e.g., $Z_{TMN}$) and/or to compensate for frequency and/or load impedance variations to provide high efficiency and desired power to the load.

In various embodiments, PA 1602 is (1) a switching inverter, (2) an amplitude-modulated linear PA, or (3) a combination of these (e.g., depending on desired output). For example, FIG. 17 shows a block diagram of illustrative PSIM amplifier, 1700, that includes switching PA 1702 (e.g., a class E, F or Φ PA, etc.) that includes a single switch (e.g., FET 1706). In other embodiments, other types of PAs might be employed, such as linear PAs (e.g., class A, B, AB or C) or other switching PAs that use more than one switch to convert DC power to RF power (e.g., class D, inverse-D, etc.).

As described, modulating the effective loading impedance $Z_{TMN}$ seen by the PA looking into the phase-switched TMN (e.g., TMN 1604 or 1710) controls the output power over the operating power range of the PSIM amplifier (e.g., amplifiers 1602 and 1702). Additionally, the operating power range of the PSIM amplifier can be further extended by also employing amplitude modulation of the PA drive signal for large output power back off.

Some embodiments might also employ other power modulation techniques such as discrete or continuous drain modulation of the power amplifier. Drain modulation of the PA modulates (e.g., switches) a bias voltage applied to a bias terminal of the PA. For example, one drain modulation technique might switching the bias voltage among multiple discrete voltage levels or continuously adjusting the bias voltage across a voltage range.

In addition to performing impedance modulation and output power control of the RF PA, a phase-switched TMN (e.g., TMN 1604 or 1710) can also compensate for variation in the load impedance $Z_L$. For example, the phase-switched TMN can be continuously tuned to match a variable load impedance to a desired RF inverter loading impedance, $Z_{TMN}$, for a given output power level, by employing the phase-switched TMN to compensate for variations in the amplifier's loading network impedance as the operating frequency changes and, thus, maintain ZVS operation. Thus, a PSIM amplifier (e.g., PSIM amplifiers 1600 and 1700) dynamically controls the output power it delivers to a widely varying load impedance, such as an RF plasma load, across a large frequency range.

Therefore, a PSIM amplifier (e.g., PSIM amplifiers 1600 and 1700) allows (1) efficient dynamic control of output power over a wide power range; (2) the ability to impedance match and deliver power into a wide-ranging load, and (3) fully zero-voltage-switching (ZVS) operation across a frequency range for frequency-agile operation.

Although the block diagrams of PSIM amplifiers 1600 and 1700 shown in FIGS. 16 and 17 show PSIM amplifiers as a cascade combination of an RF PA (e.g., RF PAs 1602 and 1702) with a phase-switched TMN (e.g., phase-switched TMNs 1604 and 1710), other embodiments integrate the PS-TMN into the design of the RF PA. As a result, such integrated PSIM amplifiers can be viewed as an RF amplifier including two or more switches, where a first switch (or group of switches) is principally responsible for generating RF power from DC input power, and a second switch (or group of switches) is principally responsible for modulating the effective impedance presented by a load network to the RF amplifier. In most embodiments, the second switch (or group of switches) will not convert DC power to RF power (e.g., the second switch provides zero power conversion from DC to RF), although in some embodiments, the second switch may convert some power from DC to RF or RF to DC.

In most embodiments a PSIM amplifier can be a zero-voltage switching (ZVS) amplifier with the switching transistors operating substantially in switched-mode and turning on and off under zero-voltage switching, enabling high efficiency to be achieved. In other implementations, a PSIM amplifier might provide switched-mode operation (e.g., saturated operation) over some of its operating range (e.g., while delivering high output power) and utilize linear-mode operation over other portions of its range.

For example, FIG. 18A shows a schematic of an illustrative topology for PSIM amplifier 1800A. As shown, PSIM amplifier 1800A is coupled to DC source 1802 coupled in series with inductor $L_F$, which is in turn coupled to the parallel combination of transistor 1804 and capacitor $C_F$. Inductor $L_F$, capacitor $C_F$, and FET 1804 generally operate to generate RF output power to the rest of the network from the DC source. Branch reactance $X_1$ is coupled between capacitor $C_F$ and node $N_2$, which is coupled to a Pi-TMN including reactance $X_2$ coupled between a first phase-switched reactance (e.g., FET 1806, branch reactance $X_{S2}$, and phase-switched variable reactance $X_{P2}$) and a second phase-switched reactance (e.g., FET 1808, branch reactance $X_{S3}$, and phase-switched variable reactance $X_{P3}$). Branch reactance $X_1$ is coupled between the Pi-TMN at node $N_1$ and the load impedance $Z_L$. The branch reactances $X_1$, $X_2$, $X_3$, $X_{S2}$, $X_{S3}$, and the phase-switched variable reactances $X_{P2}$ and $X_{P3}$ can be implemented as various different reactive networks depending on the required functionality of the design.

FIG. 18B shows an illustrative design 1800B of the PSIM amplifier topology shown in FIG. 18A. As shown in FIG. 18B, the phase-switched variable reactances (comprising FET switches 1806 and 1808 and phase-switched capacitors $C_{P2}$ and $C_{P3}$) are implemented with half-wave phase-switched capacitor network such as described in regard to FIGS. 2 and 3. As shown in FIG. 18B, the three switches 1814, 1816 and 1818 are mutually isolated at DC (e.g., by capacitors $C_{S1}$, $C_{S2}$ and $C_{S3}$, respectively. FET switch 1814 is responsible for generating all the RF power, while FET switches 1816 and 1818 are responsible for transforming and modulating the impedance presented by load $Z_L$ to the DC-to-RF portion of the circuit (e.g., at the output port of switch 1814 at node $N_2$).

FIG. 18C shows an illustrative design 1800C of the PSIM amplifier topology shown in FIG. 18A. Network 1800C is similar to network 1800B, although in network 1800C, the phase-switched capacitor networks (e.g., FET 1826 and capacitor $C_{P2}$ and FET 1828 and capacitor $C_{P3}$) are connected in series with capacitors $C_{P4}$ and $C_{P5}$, respectively. This decreases the sensitivity of the PSIM amplifier to variations in the effective reactance of the switched capacitor networks.

FIG. 18D shows an illustrative design 1800D of the PSIM amplifier topology shown in FIG. 18A where FET switches 1834 and 1836 are DC coupled (e.g., via inductor $L_{S1}$), and thus, potentially, one or both of FET switches 1834 and 1836 can be used to convert DC power into RF power or vice-versa. FET switch 1838, on the other hand, is DC-isolated (e.g., by capacitors $C_{S2}$ and $C_{S3}$) and, thus, is used only for impedance matching to the load impedance $Z_L$.

Figure 18E:
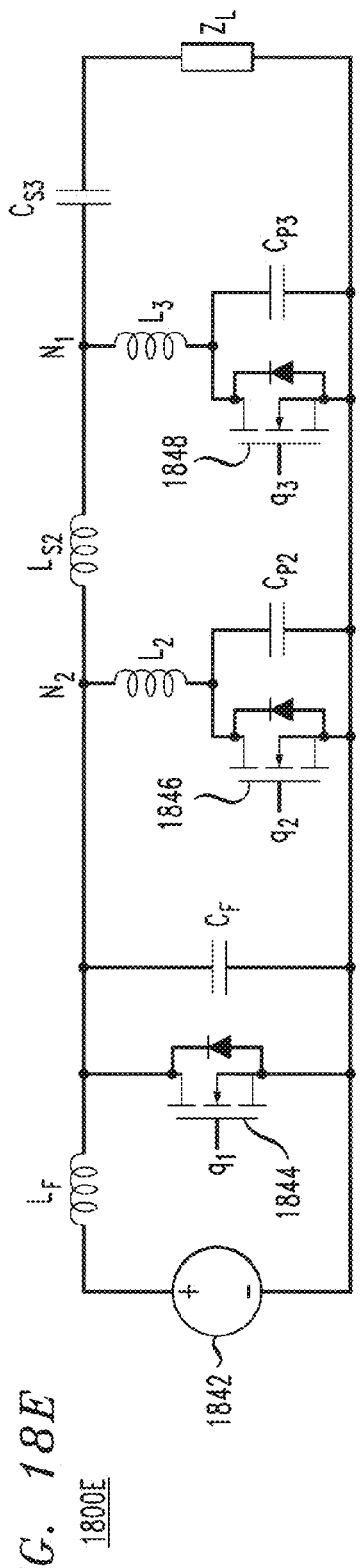

FIG. 18E shows an illustrative design 1800E of the PSIM amplifier topology shown in FIG. 18A where all three FET switches 1844, 1846 and 1848 are DC coupled (e.g., via inductor $L_{S2}$), while only the load is DC-isolated (e.g., by capacitor $C_{S3}$). Thus, in such an embodiment, all three FET switches 1844, 1846 and 1848 can potentially be used to convert between DC power and RF power and/or be responsible for impedance matching of the network to the load, though it is not necessary that all three provide each function.

As shown in FIG. 18E, the switched capacitor network of capacitor $C_F$ and FET switch 1844 is in parallel with the phase-switched network of capacitor $C_{P2}$, inductor $L_2$ and FET switch 1846. As a result, some embodiments could combine these two networks into a single switched reactive network having an input current that matches the sum of the input currents of the two switched reactive networks associated with FETs 1844 and 1846. Thus, in some embodiments, the three-switch PSIM shown in FIG. 18E can be implemented as a two-switch PSIM, such as shown in FIGS. 19 and 20.

Referring to FIG. 19, a schematic of an illustrative topology for two-switch PSIM 1900 is shown. Two-switch PSIM 1900 is coupled to RF source 1902 coupled in series with inductor $L_F$, which is in turn coupled to the parallel combination of FET 1904 and capacitor $C_F$. Branch reactance $X_1$ is coupled between capacitor CF and a phase-switched reactance network including reactance $X_{S2}$ coupled in series with the parallel combination of phase-switched reactance $X_{P2}$ and FET 1906. Branch reactance $X_2$ is coupled between the phase-switched reactance network and the load impedance $Z_L$. The branch reactances $X_1$, $X_2$ and $X_{S2}$, and the phase-switched variable reactance $X_{P2}$ can be implemented as various different reactive networks depending on the required functionality of the design. Either one of switch FETs 1904 and 1906, or both of switches 1904 and 1906, can be used to convert between DC power and RF power.

Referring to FIG. 20, an illustrative implementation of two-switch PSIM 1900 is shown having branch reactance $X_1$ implemented as inductor $L_{S1}$ and capacitor $C_{S1}$. Capacitor CS1 provides DC isolation between FET switches 2004 and 2006. Thus, FET switch 2004 generates RF power and FET switch 2006 modulates the impedance presented to the source.

FIG. 21 shows an illustrative implementation of a three-switch PSIM amplifier 2100. PSIM amplifier 2100 operates over a 20.86 MHz to 27.12 MHz frequency range (a factor of 1.3 in frequency). Further, PSIM amplifier 2100 provides the ability for 10:1 dynamic control of the output power delivered to the load having an impedance, $Z_L$, of 50Ω with a ±10% impedance variation (resistive and reactive).

PSIM amplifier 2100 includes RF PA (inverter) 2102, Pi-TMN 2104, branch filter 2106, and load impedance $Z_L$. RF PA 2102 includes FET switch 2108, inductor $L_F$ and an output network formed by capacitors $C_F$ and $C_{S1}$ and inductor $L_{S1}$. In the embodiment shown in FIG. 21, RF PA 2102 is a modified class E inverter with FET switch 2108 converting between DC power and RF power. Pi-TMN 2104 includes a first phase-switched capacitor (e.g., $C_{P2}$ and FET 2110) and a second phase-switched capacitor (e.g., $C_{P1}$ and FET 2112). Branch filter 2106 includes inductor $L_{S3}$ and capacitor $C_{S3}$ coupled between Pi-TMN 2104 and load $Z_L$.

RF PA 2102 maintains zero-voltage-switching (ZVS) and high efficiency at different output power levels when Pi-TMN 2104 maintains the inverter load impedance $Z_{TMN}$ as an approximately resistive load at the frequency of operation of RF PA 2102. RF PA 2102 generates peak RF power when $Z_{TMN}$ is 50Ω (e.g., matches load impedance $Z_L$). Dynamic control of power back off of RF PA 2102 can be achieved by Pi-TMN 2104 modulating $Z_{TMN}$.

For operation over a 20.86 MHz to 27.12 MHz frequency range, the illustrative embodiment of PSIM amplifier 2100 shown in FIG. 21 employs inductor $L_F$ having a value of 113 nH, capacitor $C_F$ having a value of 180 pF, capacitor $C_{S1}$ having a value of 15.2 pF, inductor $L_{S1}$ having a value of 3.81 µH, phase-switched capacitor $C_{P2}$ having a physical value, $C_0$, of 152 pF, inductor $L_{S2}$ having a value of 381 nH, capacitor $C_{S2}$ having a value of 0.01 µF, phase-switched capacitor $C_{P1}$ having a physical value, $C_0$, of 152 pF, inductor $L_{S3}$ having a value of 3.81 µH, and capacitor $C_{S3}$ having a value of 15.2 pF. In some embodiments, Pi-TMN 2104 employs half-wave switched capacitor networks (e.g., capacitor $C_{P2}$ and FET 2110 and capacitor $C_{P1}$ and FET 2112).

The series reactive network branch formed by capacitor $C_{S2}$ and inductor $L_{S2}$ has a 50Ω inductive impedance at a frequency of 20.86 MHz and also DC isolates the two switched networks (e.g., capacitor $C_{P2}$ and FET 2110 and capacitor $C_{P1}$ and FET 2112). The impedance of capacitor $C_{S2}$ and inductor $L_{S2}$ sets the resistive range over which $Z_{TMN}$ of Pi-TMN 2104 can be modulated. The series resonant network formed by capacitor $C_{S3}$ and inductor $L_{S3}$ provides additional filtering of the load current $I_L$ and prevents DC currents and high-frequency harmonic content being coupled to the load $Z_L$. Pi-TMN 2104 can modulate the impedance, $Z_{TMN}$, presented to RF PA 2102 by appropriately driving FET switches 2110 and 2112, for example by adjusting the conduction angles of the FETs. By modulating the impedance $Z_{TMN}$ presented to RF PA 2102, Pi-TMN 2014 can control the output power that is delivered from RF PA 2102 to load $Z_L$.

FIG. 22 shows an illustrative impedance range (e.g., shaded region 2202) over which $Z_{TMN}$ of Pi-TMN 2104 can be adjusted at 20.86 MHz. FIG. 23 shows an illustrative impedance range (e.g., shaded region 2302) over which $Z_{TMN}$ of Pi-TMN 2104 can be adjusted at 27.12 MHz. Smith charts 2200 and 2300 are normalized to 50Ω. Shaded regions 2202 and 2302 illustrate that Pi-TMN 2104 can match load impedance $Z_L$ over a 10:1 range by varying phase-switched capacitor $C_{P1}$ over a 1:6 impedance range (e.g., varying the switching angle, $\alpha_1$, of PET 2112 over approximately 0 degrees to 125 degrees) and varying phase-switched capacitor $C_{P1}$ over a 1:10 impedance range (e.g., varying the switching angle, $\alpha_2$, of FET 2110 over approximately 0 degrees to 135 degrees). Furthermore, ZTMN can be modulated to account for a ±10% variation in the load impedance $Z_L$ (both resistive and reactive) at the frequency of operation of RF PA 2102.

To set the correct value of switching angle, $\alpha_1$, of FET 2112 and switching angle, $\alpha_2$, of FET 2110 for Pi-TMN 2104 to achieve a given impedance, LUT 108 might store predetermined switching angles (e.g., $\alpha_1$ and $\alpha_2$) corresponding to various impedances. For example, table 3 shows an illustrative list of possible impedances $Z_{TMN}$ that can be matched to a 50Ω load impedance $Z_L$ and the corresponding switching angles (e.g., $\alpha_1$ and $\alpha_2$). The values of table 3 might be determined based upon simulation of PSIM amplifier 2100, where FETs 2110 and 2112 are modeled having an on-state resistance of 10 mΩ and a body diode having a 0.4V forward voltage drop. The output power listed in table 3 includes power delivered at the fundamental and higher frequencies when the PSIM amplifier is supplied with a 48 VDC power supply.

TABLE 3

| Switching Frequency (MHz) | $\alpha_1$ (degrees) | $\alpha_2$ (degrees) | TMN Impedance $Z_{TMN}$ (Ω) | Output Power (W) |
|---|---|---|---|---|
| 27.12 | 82.1 | 48.6 | 55.5 + 6.06j | 19.8 |
| 27.12 | 64.4 | 68.3 | 125 − 1.60j | 12.3 |
| 27.12 | 61.3 | 66.4 | 500 − 1.14j | 3.5 |
| 20.86 | 0.10 | 0.10 | 48.9 − 1.20j | 58.6 |
| 20.86 | 146 | 87.7 | 498 − 5.90j | 5.4 |

As described, PSIM amplifier 2100 maintains zero-voltage-switching of all FET switches across a wide range of output power, loading impedance, and frequency of operation. For example, for illustrative PSIM amplifier 2100 to deliver an output power of 58.6 W to 50Ω load $Z_L$ at 20.86 MHz with a power supply voltage of 48 VDC, TMN 2102 is required to provide nearly a 1:1 impedance match (e.g., $Z_L=Z_{TMN}=50Ω$). Under this operating condition, the required effective shunt capacitance at nodes $N_1$ and $N_2$ is equivalent to the $C_{P1}$ and $C_{P2}$ capacitances, respectively, and hence FET switches 2110 and 2112 are off during the entire cycle and the drain voltage waveforms of FET switches 2110 and 2112 would be sinusoidal.

As another example, for illustrative PSIM amplifier 2100 to deliver an output power of 3.50 W to 50Ω load $Z_L$ at 27.12 MHz with a power supply voltage of 48 VDC, TMN 2102 is required to provide an impedance $Z_{TMN}$ of approximately 500Ω (as shown in table 3). Under this operating condition, the required effective shunt capacitance at nodes $N_1$ and $N_2$ is higher than the $C_{P1}$ and $C_{P2}$ capacitances, respectively, and hence FET switches 2110 and 2112 are turned on for a certain portion of the cycle while maintaining ZVS. Despite high frequency harmonic content of the drain voltage waveforms of FET switches 2110 and 2112, the load current $I_L$ flowing through load $Z_L$ should remain nearly sinusoidal. Thus, PSIM amplifier 2100 is capable of providing dynamic output power control while matching into a variable load across a range of switching frequencies.

Therefore, as described herein, various embodiments provide tunable matching networks based upon phase-switched variable network reactance elements, referred to herein as phase-switched tunable matching networks (PS-TMNs). Such PS-TMNs provide rapid, high bandwidth, continuous impedance matching over a wide impedance range, while operating efficiently at high power levels without requiring high bias voltages or currents. Such PS-TMNs might be employed alone, or might also be employed in combination with other matching techniques such as discrete switched reactance banks. Described embodiments also provide zero voltage switching (ZVS) radio frequency (RF) amplifiers, referred to herein as phase-switched impedance modulation (PSIM) amplifiers. Such PSIM amplifiers might employ a PS-TMN to operate over a large frequency range by efficiently modulating output power over a wide frequency range and matching into highly variable loads (e.g., match to a wide impedance range).

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Some embodiments might be implemented in the form of methods and apparatuses for practicing those methods. Further, as would be apparent to one skilled in the art, various functions of circuit elements might also be implemented as processing blocks in a software program. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

It should be understood that the steps of the methods set forth herein are not necessarily required to be performed in the order described, and the order of the steps of such methods should be understood to be merely illustrative. Likewise, additional steps may be included in such methods, and certain steps may be omitted or combined, in methods consistent with various embodiments.

It will be further understood that various changes in the details, materials, and arrangements of the parts that have been described and illustrated herein might be made by those skilled in the art without departing from the scope of the following claims.

We claim:

1. A phased switched tunable impedance network having an input configured to be coupled to a source and having an output configured to be coupled to a load, the tunable impedance network comprising:
    one or more phase-switched reactive elements; and
    a controller configured to provide a respective control signal to each of the one or more phase-switched reactive elements such that, in response to the respective control signal provided thereto, each phase-switched reactive element provides a corresponding selected reactance value.

2. The tunable impedance network of claim 1, wherein each of the one or more phase-switched reactances comprises:
    one or more reactive elements and at least one switch,
    wherein at least one of the one or more reactive elements is configured to be switched into and out of the reactance network by at least one switch associated therewith.

3. The tunable impedance network of claim 2, wherein the at least one associated switch is operable at a switching frequency related to a frequency of an RF signal provided by the source and a switching phase based upon the respective control signal.

4. The tunable impedance network of claim 3, wherein the controller is configured to determine the switching frequency and select the switching phase based upon at least one of: a feedback circuit, a feedforward circuit, and an adaptive predistortion system.

5. The tunable impedance network of claim 4, wherein the adaptive predistortion system comprises a lookup table.

6. The tunable impedance network of claim 3, wherein the at least one switch is operable in a half-wave switching configuration to switch on and off once per cycle of the RF signal at the output port of the RF amplifier.

7. The tunable impedance network of claim 3, wherein the at least one switch is operable in a full-wave switching configuration to switch on and off twice per cycle of the RF signal at the output port of the RF amplifier.

8. The tunable impedance network of claim 3, wherein the switching frequency and the switching phase are selected to provide the phase-switched reactance having a desired reactance value.

9. The tunable impedance network of claim 3, wherein the at least one switch is operable to provide at least one of zero-voltage-switching (ZVS) and zero-current-switching (ZCS) of said switch.

10. The tunable impedance network of claim 3, wherein, the phase-switched reactance is a capacitive element, and the capacitance value of the phase-switched capacitive element at a desired frequency is related to a physical DC capacitance value of the phase-switched capacitive element and the switching phase.

11. The tunable impedance network of claim 3, wherein, the phase-switched reactance is an inductive element, and the inductance value of the phase-switched inductive element at a desired frequency is related to a physical DC inductance value of the phase-switched inductive element and the switching phase.

12. The tunable impedance network of claim 2, wherein the one or more reactance elements comprises a plurality of reactive elements and the at least one switch comprises a plurality of switches, each of the plurality of switches corresponding to a different one of the plurality of reactive elements.

13. The tunable impedance network of claim 1, wherein setting each phase-switched reactance to a corresponding desired reactance value achieves an impedance match between the source and the load.

14. The tunable impedance network of claim 1, wherein setting each phase-switched reactance to a corresponding desired reactance value achieves a desired impedance ratio between the source and the load.

15. The tunable impedance network of claim 1, wherein setting each phase-switched reactance to a corresponding desired reactance value achieves a desired first impedance to the source, and a desired second impedance to the load.

16. The tunable impedance network of claim 1, further comprising:
    a digital reactance matrix comprising N selectable reactive elements to adjust an effective reactance value of the digital reactance matrix, where N is a positive integer.

17. The tunable impedance network of claim 1, further comprising:
    one or more analog variable reactive elements.

18. The tunable impedance network of claim 1, wherein the source comprises at least one of a radio frequency (RF) source, an RF power amplifier (PA), and a switched-mode inverter.

19. The tunable impedance network of claim 1, wherein the load comprises at least one of an antenna, a transmission line and a plasma load.

20. The tunable impedance network of claim 1, wherein the input of the tunable impedance network is coupled to a radio frequency (RF) amplifier system, the tunable impedance network configured to modulate a load impedance of the RF amplifier system to control a power level of the RF amplifier system.

21. The tunable impedance network of claim 1, further comprising:
    one or more filter components configured to reduce harmonic content coupled to at least one of the input and the output.

22. A phased switched tunable impedance network having an input configured to be coupled to a source and having an output configured to be coupled to a load, the tunable impedance network comprising:
    one or more phase-switched reactive elements; and
    a controller configured to provide a respective control signal to each of the one or more phase-switched reactive elements such that, in response to the respective control signal provided thereto, each phase-switched reactive element provides a corresponding selected one of a plurality of different reactance values.

* * * * *